United States Patent
De Simone et al.

(10) Patent No.: US 11,500,296 B2
(45) Date of Patent: Nov. 15, 2022

(54) METHOD OF UNLOADING AN OBJECT FROM A SUPPORT TABLE

(71) Applicant: ASML NETHERLANDS B.V., Veldhoven (NL)

(72) Inventors: Giovanna De Simone, Eindhoven (NL); Marco Adrianus Peter Van Den Heuvel, Waalre (NL); Thibault Simon Mathieu Laurent, Eindhoven (NL); Ruud Hendrikus Martinus Johannes Bloks, Helmond (NL); Niek Jacobus Johannes Roset, Eindhoven (NL); Justin Johannes Hermanus Gerritzen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/519,713

(22) Filed: Nov. 5, 2021

(65) Prior Publication Data
US 2022/0057722 A1 Feb. 24, 2022

Related U.S. Application Data

(63) Continuation of application No. 16/617,242, filed as application No. PCT/EP2018/061287 on Jan. 18, 2018, now Pat. No. 11,175,594.

(30) Foreign Application Priority Data

Jun. 6, 2017 (EP) ..................................... 17174583
Jan. 18, 2018 (EP) ..................................... 18152220

(51) Int. Cl.
*G03F 7/20* (2006.01)

(52) U.S. Cl.
CPC ...... *G03F 7/70725* (2013.01); *G03F 7/70775* (2013.01)

(58) Field of Classification Search
CPC .. G03F 7/70725; G03F 7/70775; G03F 7/707; G03F 7/70341; H01L 21/6838; H01L 21/6875
(Continued)

(56) References Cited

U.S. PATENT DOCUMENTS 5,203,547 A 4/1993 Marumo
6,466,046 B1 10/2002 Maruyama et al.
(Continued)

FOREIGN PATENT DOCUMENTS

EP 1420298 5/2004
EP 1641028 3/2006
(Continued)

OTHER PUBLICATIONS

International Search Report dated Oct. 19, 2018 issued in corresponding International Patent Application No. PCT/EP2018/061287.
(Continued)

*Primary Examiner* — Hung V Nguyen
(74) *Attorney, Agent, or Firm* — Pillsbury Winthrop Shaw Pittman LLP

(57) ABSTRACT

A method of unloading an object from a support table, the object clamped to the support table during an exposure process by: applying a first pressure to a central region of the support table under a central portion of the object; and applying a second pressure to a peripheral region of the support table under a peripheral portion of the object, wherein during clamping the first pressure and the second pressure are controlled such that liquid is retained between the object and a seal member that is positioned radially
(Continued)

between the central region and the peripheral region at an upper surface of the support table and protrudes towards the object, the method including: increasing the first pressure towards ambient pressure; removing at least some of the liquid retained between the object and the seal member by decreasing the second pressure; and increasing the second pressure towards the ambient pressure.

20 Claims, 14 Drawing Sheets

(58) Field of Classification Search
USPC .................................................. 355/72–76
See application file for complete search history.

(56) References Cited

U.S. PATENT DOCUMENTS

| | | | |
|---|---|---|---|
| 6,927,839 | B2 | 8/2005 | Taniguchi et al. |
| 7,342,237 | B2 | 3/2008 | Severijns et al. |
| 8,033,815 | B2 * | 10/2011 | Babbs ............... H01L 21/6838 |
| | | | 425/193 |
| 2003/0141673 | A1 | 7/2003 | Olgado et al. |
| 2004/0036850 | A1 | 2/2004 | Tsukamoto et al. |
| 2004/0207824 | A1 | 10/2004 | Lof et al. |
| 2005/0036267 | A1 | 2/2005 | Savas et al. |
| 2005/0219499 | A1 | 10/2005 | Maria Zaal et al. |
| 2006/0139614 | A1 | 6/2006 | Owa et al. |
| 2006/0172031 | A1 | 8/2006 | Babbs et al. |
| 2006/0197036 | A1 | 9/2006 | Severijns |
| 2007/0195653 | A1 | 8/2007 | Yassour et al. |
| 2008/0043210 | A1 | 2/2008 | Shibuta |
| 2008/0111984 | A1 | 5/2008 | Shibuta |
| 2008/0297744 | A1 | 12/2008 | Eduard De Jong et al. |
| 2009/0296056 | A1 | 12/2009 | Mondt et al. |
| 2010/0045949 | A1 | 2/2010 | Nakano et al. |
| 2010/0195980 | A1 | 8/2010 | Jung et al. |
| 2010/0248446 | A1 | 9/2010 | Liu et al. |
| 2013/0321788 | A1 | 12/2013 | Ockwell et al. |
| 2015/0109599 | A1 | 4/2015 | Koevoets |

FOREIGN PATENT DOCUMENTS

| | | |
|---|---|---|
| JP | 2005294838 | 10/2005 |
| JP | 2006237606 | 9/2006 |
| JP | 2008311575 | 12/2008 |
| JP | 2010-128079 | 6/2010 |
| JP | 2015519755 | 7/2015 |
| JP | 2017016160 | 1/2017 |
| KR | 20060009356 | 1/2006 |
| WO | 2004102646 | 11/2004 |
| WO | 2004112108 | 12/2004 |
| WO | 2013/178484 | 12/2013 |
| WO | 2016207122 | 12/2016 |
| WO | 2017/137129 | 8/2017 |

OTHER PUBLICATIONS

Korean Office Action issued In corresponding Korean Patent Application No. 10-2019-7036175, dated Jun. 23, 2021.
Japanese Office Action issued in corresponding Japanese Patent Application No. 2019-564064, dated Jun. 28, 2021.
Japanese Office Action issued in corresponding Japanese Patent Application No. 2019-564064, dated Dec. 4, 2020.

* cited by examiner

METHOD OF UNLOADING AN OBJECT FROM A SUPPORT TABLE

This application is a continuation of U.S. patent application Ser. No. 16/617,242, filed Nov. 26, 2019, which is the U.S. national phase entry of PCT Patent Application No. PCT/EP2018/061287, filed on May 3, 2018, which claims the benefit of priority of European Patent Application No. 17174583.9, filed on Jun. 6, 2017, and of European Patent Application No. 18152220.2, filed on Jan. 18, 2018, each of the foregoing applications is incorporated herein in its entirety by reference.

FIELD

The present disclosure relates to a method of unloading an object from a support table during an unloading process, a lithographic apparatus, a vacuum system for a support table of a lithographic apparatus for holding an object, and a positioner.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

To project a pattern on the substrate the lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on the substrate than a lithographic apparatus which uses, for example, radiation with a wavelength of 193 nm.

Immersion techniques have been introduced into lithographic systems to enable improved resolution of smaller features. In an immersion lithographic apparatus, a liquid layer of immersion liquid having a relatively high refractive index is interposed in a space between a projection system of the apparatus (through which the patterned beam is projected towards the substrate) and the substrate. The immersion liquid covers at last the part of the substrate under a final element of the projection system. Thus, at least the portion of the substrate undergoing exposure is immersed in the liquid. The effect of the immersion liquid is to enable imaging of smaller features since the exposure radiation will have a shorter wavelength in the immersion liquid than gas. (The effect of the liquid may also be regarded as increasing the effective numerical aperture (NA) of the system and also increasing the depth of focus.)

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the space as immersion liquid. Other liquids with a high refractive index can be used besides water can be used as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the space between the final element and a surface facing the final element. The facing surface is a surface of substrate or a surface of a support table (or a substrate support) that is co-planar with the surface of the substrate. (Please note that reference in the following text to surface of the substrate also refers in addition or in the alternative to a surface of the substrate support, unless expressly stated otherwise; and vice versa). A fluid handling structure present between the projection system and the stage is used to confine the immersion liquid to the space. The space filled by immersion liquid is smaller in plan than the top surface of the substrate and the space remains substantially stationary relative to the projection system while the substrate and substrate stage move underneath.

Other immersion systems have been envisaged such as an unconfined immersion system (a so-called 'All Wet' immersion system) and a bath immersion system. In an unconfined immersion system, the immersion liquid covers more than the surface under the final element. The liquid outside the space is present as a thin liquid film. The immersion liquid may cover the whole surface of the substrate or even the substrate and the support table co-planar with the substrate. In a bath type system, the substrate is fully immersed in a bath of immersion liquid.

A fluid handling structure is a structure which supplies the immersion liquid to the space, removes the immersion liquid from the space and thereby confines the immersion liquid to the space. It includes features which are a part of a fluid supply system. FIGS. 2 and 3 show different supply devices which can be used in such a system. The fluid handling structure extends along at least a part of a boundary of the space between the final element of the projection system and the support table or substrate, so as to in part define the space.

The fluid handing structure may have a selection of different functions. Each function may be derived from a corresponding feature that enables the fluid handling structure to achieve that function. The fluid handling structure may be referred to by a number of different terms, each referring to a function, such as barrier member, seal member, fluid supply system, fluid removal system, liquid confinement structure, etc.

As a barrier member, the fluid handling structure is a barrier to the flow of the immersion liquid from the space. As a liquid confinement structure, the structure confines the immersion liquid to the space. As a seal member, sealing features of the fluid handling structure form a seal to confine the immersion liquid to the space. The sealing features may include an additional gas flow from an opening in the surface of the seal member, such as a gas knife.

In an immersion apparatus, a liquid (e.g. water) meniscus is stabilised at a seal between the back side of the substrate and the top of the support table. When removing the substrate from the support table, part of this liquid can remain on the substrate and on the support table. It is desirable to reduce the amount of liquid that remains on the substrate and/or on the support table when removing the substrate from the support table.

SUMMARY

According to an aspect, there is provided a method of unloading an object from a support table during an unloading process, the object clamped to the support table during an exposure process by:

applying a first pressure to a central region of the support table under a central portion of the object; and applying a second pressure to a peripheral region of the support table under a peripheral portion of the object, wherein during clamping the first pressure and the second pressure are controlled such that liquid is retained between the object and a seal member that is positioned radially between the central region and the peripheral region at an upper surface of the support table and protrudes towards the object, the method comprising:

increasing the first pressure towards ambient pressure;

removing at least some of the liquid retained between the object and the seal member by decreasing the second pressure; and increasing the second pressure towards the ambient pressure.

According to an aspect, there is provided a lithographic apparatus comprising:

a support table for holding an object, the support table comprising:

a first channel for applying a first pressure to a central region thereof under a central portion of the object;

a second channel for applying a second pressure to a peripheral region thereof under a peripheral portion of the object; and a seal member positioned radially between the first channel and the second channel at an upper surface of the support table and protruding towards the object; and a controller adapted to:

control application of the first pressure and the second pressure during an exposure process such that liquid is retained between the object and the seal member during the exposure process;

increase the first pressure towards ambient pressure;

decrease the second pressure such that at least some of the liquid retained between the object and the seal member is removed; and increase the second pressure towards the ambient pressure during an unloading process.

According to an aspect, there is provided a vacuum system for a substrate table and a support table of a lithographic apparatus, the support table being for holding an object, the vacuum system comprising a flow circuit that comprises:

a first pressure circuit comprising a first vacuum pressure line configured to clamp the support table to the substrate table;

a second pressure circuit comprising:

a second vacuum pressure line configured to apply a second pressure to a peripheral region of the support table under a peripheral portion of the object;

a third vacuum pressure line configured to apply a first pressure to a central region of the support table under a central portion of the object so as to clamp the object to the support table;

a vacuum device configured to provide a pressure to the second pressure circuit; and a fourth vacuum pressure line branching off the second pressure circuit;

a first flow controller for controlling a pressure in the second vacuum pressure line; and a second flow controller for controlling a pressure in the fourth vacuum pressure line.

According to an aspect, there is provided a vacuum system for a substrate table and a support table of a lithographic apparatus, the support table being for holding an object, the vacuum system comprising a flow circuit that comprises:

a first pressure circuit comprising:

a first vacuum pressure line configured to clamp the support table to the substrate table;

a second vacuum pressure line configured to apply a second pressure to a peripheral region of the support table under a peripheral portion of the object;

a third vacuum pressure line configured to apply a first pressure to a central region of the support table under a central portion of the object so as to clamp the object to the support table;

a first flow controller for controlling a pressure in the second vacuum pressure line; and a fourth flow controller for controlling flow from ambient pressure to the third vacuum pressure line.

According to an aspect, there is provided a vacuum system for a substrate table and a support table of a lithographic apparatus, the support table being for holding an object, the vacuum system comprising a flow circuit that comprises:

a first pressure circuit comprising:

a first vacuum pressure line configured to clamp the support table to the substrate table; and a third vacuum pressure line configured to apply a first pressure to a central region of the support table under a central portion of the object so as to clamp the object to the support table;

a second pressure circuit comprising a second vacuum pressure line configured to apply a second pressure to a peripheral region of the support table under a peripheral portion of the object;

a first flow controller for controlling a pressure in the second vacuum pressure line; and a fifth flow controller for controlling a pressure in the third vacuum pressure line.

A vacuum system for a substrate table and a support table of a lithographic apparatus, the support table being for holding an object, the vacuum system comprising a flow circuit that comprises:

a first pressure circuit comprising:

a first vacuum pressure line configured to clamp the support table to the substrate table; and a second pressure circuit comprising:

a second vacuum pressure line configured to apply a second pressure to a peripheral region of the support table under a peripheral portion of the object; and a third vacuum pressure line configured to apply a first pressure to a central region of the support table under a central portion of the object so as to clamp the object to the support table, wherein the third vacuum pressure line is connected to the second vacuum pressure line via a flow controller for retaining a predetermined difference in pressure between the second vacuum pressure line and the third vacuum pressure line; and a further flow controller for controlling flow from ambient pressure to the second vacuum pressure line.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
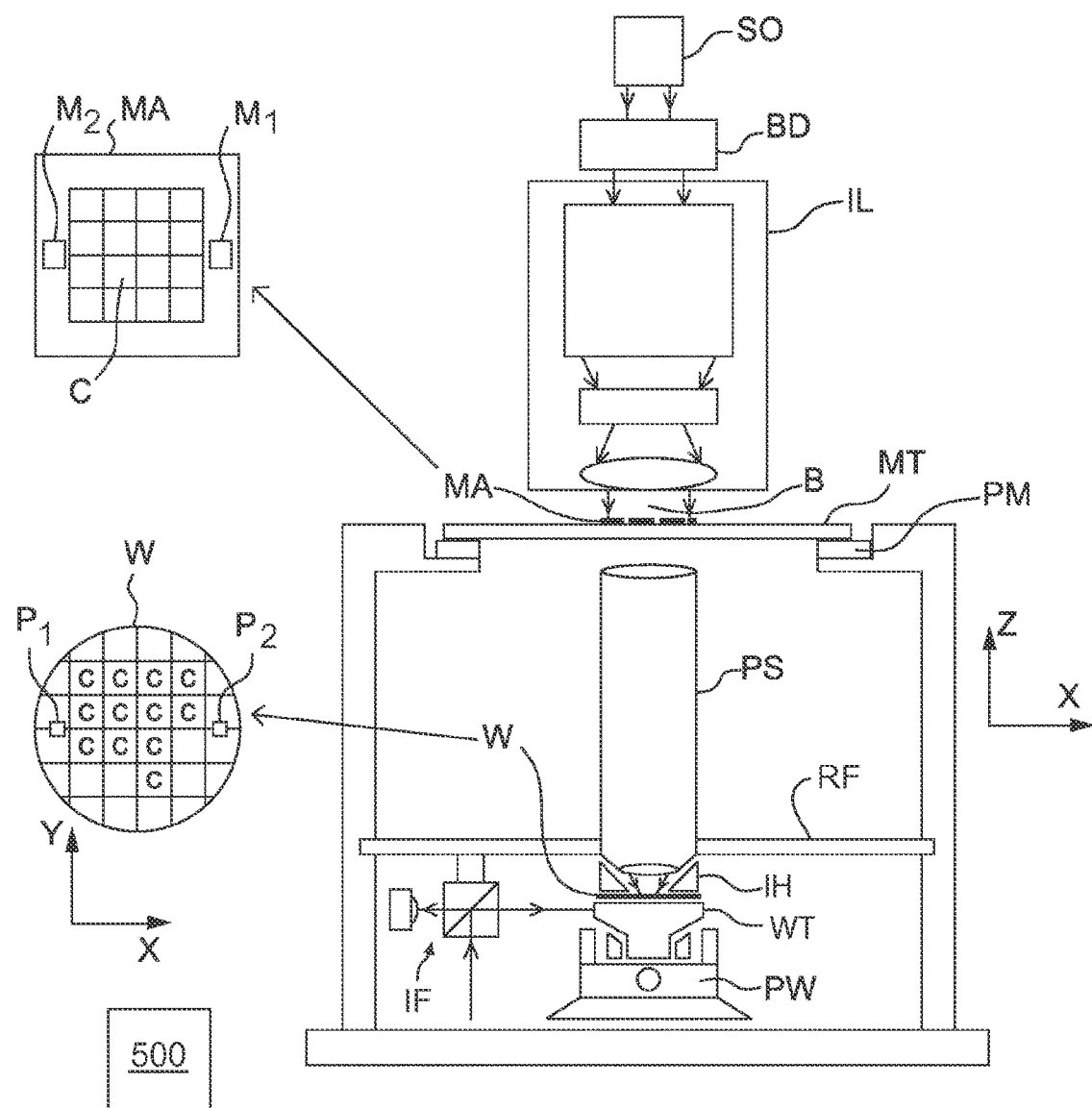
FIG. 1 depicts a lithographic apparatus according to an embodiment of the invention.

FIG. 1 schematically depicts a lithographic apparatus. The apparatus comprises:
a. optionally, an illumination system (illuminator) IL configured to condition a radiation beam B (e.g. UV radiation or DUV radiation);
b. a support structure (e.g. a mask table) MT constructed to support a patterning device (e.g. a mask) MA and connected to a first positioner PM configured to accurately position the patterning device MA in accordance with certain parameters;
c. a support table, e.g. a sensor table to support one or more sensors or a support table WT constructed to hold a substrate (e.g. a resist-coated substrate) W, connected to a second positioner PW configured to accurately position the surface of the table, for example of a substrate W, in accordance with certain parameters; and
d. a projection system (e.g. a refractive projection lens system) PS configured to project a pattern imparted to the radiation beam B by patterning device MA onto a target portion C (e.g. comprising one or more dies) of the substrate W.

In operation, the illumination system IL receives a radiation beam from a source SO or radiation, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system".

The lithographic apparatus may be of a type having two or more support tables, e.g., two or more support tables or a combination of one or more support tables and one or more cleaning, sensor or measurement tables. For example, the lithographic apparatus is a multi-stage apparatus comprising two or more tables located at the exposure side of the projection system, each table comprising and/or holding one or more objects. In an example, one or more of the tables may hold a radiation-sensitive substrate. In an example, one or more of the tables may hold a sensor to measure radiation from the projection system. In an example, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In operation, the radiation beam B is incident on the pattern (design layout) present on patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the support table WT can be moved accurately, e.g. so as to position different target portions C in the path of the radiation beam B at a focused and aligned position. Similarly, the first positioner PM and another position sensor (which is not explicitly depicted in FIG. 1) can be used to accurately position the patterning device MA with respect to the path of the radiation beam B. Patterning device MA and substrate W may be aligned using patterning device alignment marks $M_1$, $M_2$ and substrate alignment marks $P_0$, $P_1$. Although the substrate alignment marks $M_1$, $M_2$ as illustrated occupy dedicated target portions, they may be located in spaces between target portions C (these are known as scribe-lane alignment marks).

Figure 2:
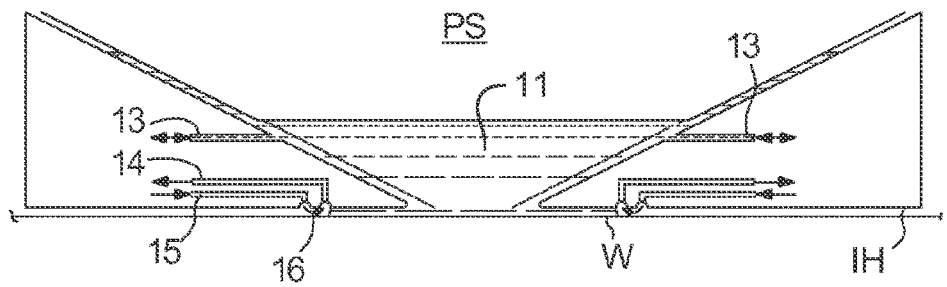
FIG. 2 depicts a liquid supply system for use in a lithographic projection apparatus.

FIG. 2 schematically depicts a localized liquid supply system or fluid handling system. The liquid supply system is provided with a fluid handling structure IH (or liquid confinement structure), which extends along at least a part of a boundary of the space 11 between the final element of the projection system PS and the support table WT or substrate W. The fluid handling structure IH is substantially stationary relative to the projection system PS in the XY plane though there may be some relative movement in the Z direction (in the direction of the optical axis). In an example, a seal is formed between the fluid handling structure IH and the surface of the substrate W and may be a contactless seal such as a gas seal (such a system with a gas seal is disclosed in EP1,420,298) or liquid seal.

The fluid handling structure IH at least partly confines the immersion liquid in the space 11 between the final element of the projection system PS and the substrate W. The space 11 is at least partly formed by the fluid handling structure IH positioned below and surrounding the final element of the projection system PS. Immersion liquid is brought into the space 11 below the projection system PS and within the fluid handling structure IH by one of liquid openings 13. The immersion liquid may be removed by another of liquid openings 13. The immersion liquid may be brought into the space 11 through at least two liquid openings 13. Which of liquid openings 13 is used to supply the immersion liquid and optionally which is used to remove the immersion liquid may depend on the direction of motion of the support table WT.

The immersion liquid may be confined in the space 11 by a contactless seal such as a gas seal 16 formed by a gas which, during use, is formed between the bottom of the fluid handling structure IH and the surface of the substrate W. The gas in the gas seal 16 is provided under pressure via inlet 15 to the gap between the fluid handling structure IH and substrate W. The gas is extracted via outlet 14. The overpressure on the gas inlet 15, vacuum level on the outlet 14 and geometry of the gap are arranged so that there is a high-velocity gas flow inwardly that confines the immersion liquid. Such a system is disclosed in US 2004/0207824, which is hereby incorporated by reference in its entirety. In an example, the fluid handling structure IH does not have the gas seal 16.

Figure 3:
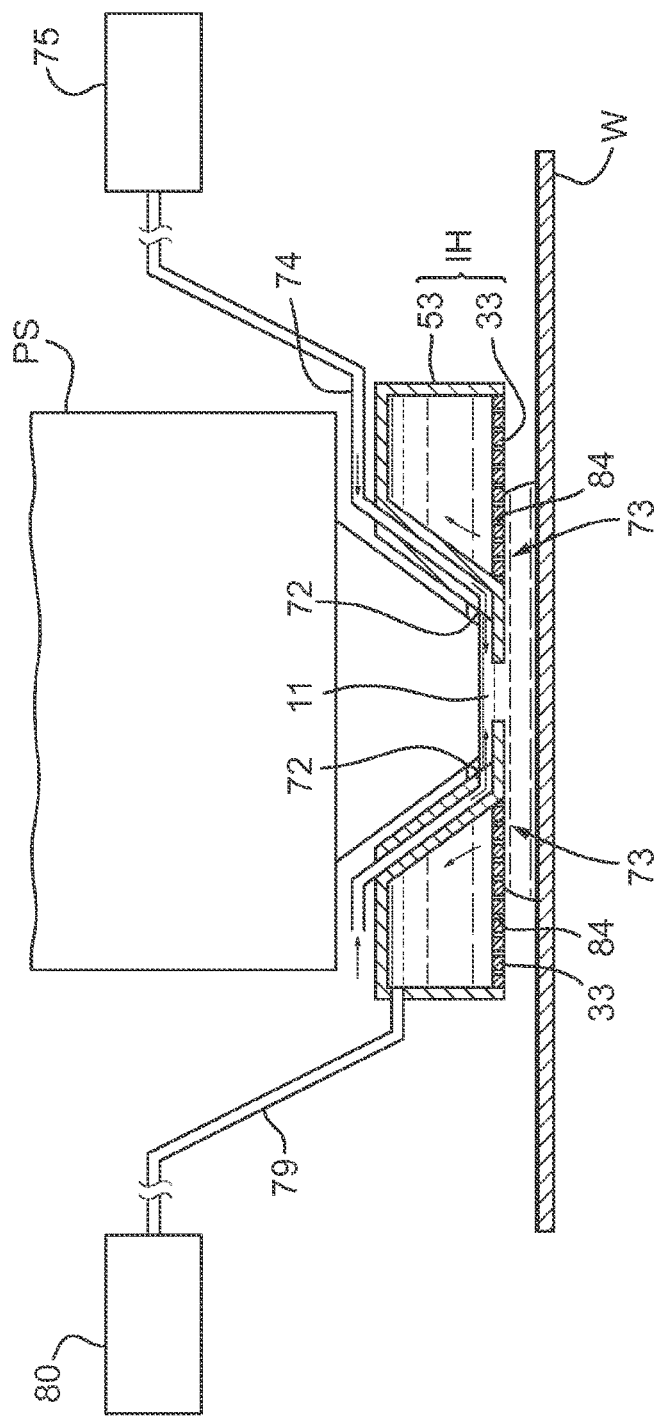
FIG. 3 is a side cross sectional view that depicts a further liquid supply system according to an embodiment.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a fluid handling structure IH (or a liquid confinement structure), which extends along at least a part of a boundary of the space 11 between the final element of the projection system PS and the support table WT or substrate W.

The fluid handling structure IH at least partly confines the immersion liquid in the space 11 between the final element of the projection system PS and the substrate W. The space 11 is at least partly formed by the fluid handling structure IH positioned below and surrounding the final element of the projection system PS. In an example, the fluid handling structure IH comprises a main body member 53 and a porous member 33. The porous member 33 is plate shaped and has a plurality of holes (i.e., openings or pores). In an embodiment, the porous member 33 is a mesh plate wherein numerous small holes 84 are formed in a mesh. Such a system is disclosed in US 2010/0045949 A1, which is hereby incorporated by reference in its entirety.

The main body member 53 comprises supply ports 72, which are capable of supplying the immersion liquid to the space 11, and a recovery port 73, which is capable of recovering the immersion liquid from the space 11. The supply ports 72 are connected to a liquid supply apparatus 75 via passageways 74. The liquid supply apparatus 75 is capable of supplying the immersion liquid to the supply ports 72 through the corresponding passageway 74. The recovery port 73 is capable of recovering the immersion liquid from the space 11. The recovery port 73 is connected to a liquid recovery apparatus 80 via a passageway 79. The liquid recovery apparatus 80 recovers the immersion liquid recovered via the recovery port 73 through the passageway 29. The porous member 33 is disposed in the recovery port 73. Performing the liquid supply operation using the supply ports 72 and the liquid recovery operation using the porous member 33 forms the space 11 between the projection system PS and the fluid handling structure IH on one side and the substrate W on the other side.

Figure 4:
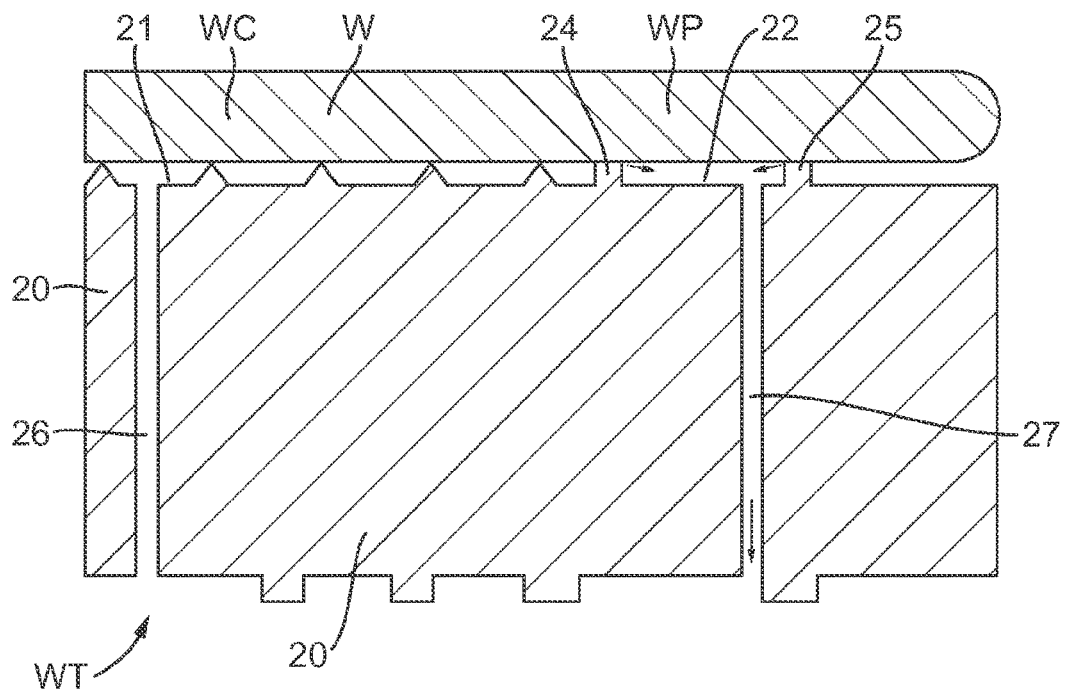
FIG. 4 schematically depicts a substrate supported on a support table according to an embodiment of the invention.

FIG. 4 schematically depicts in cross-section a substrate W supported on a support table WT. Embodiments of the present invention will be described below in relation to a substrate W as an example of an object, and a support table WT as an example of a support table. However, the present invention is not limited to the context of a substrate W supported on a support table WT. For example, an embodiment of the present invention is also applicable to a patterning device MA supported by a support structure MT.

As depicted in FIG. 4, the substrate W is supported by the support table WT. During use of the lithographic apparatus, the substrate W may be clamped to the support table WT. For example, the substrate W is clamped to the support table WT during an exposure process. Between exposure processes, the substrate W may be unloaded from the support table WT. For example, the substrate W may be removed from the substrate WT during a substrate exchange sequence.

As shown in FIG. 4, in an embodiment the support table WT comprises a first channel 26. The first channel 26 is for applying a first pressure p1 to a central region 21 of the support table WT under a central portion WC of the substrate W. As shown in FIG. 4, in an embodiment the first channel 26 is provided to extend through a main body 20 of the support table WT. In an embodiment, the first channel 26 is connected to a pressure circuit configured to apply the first pressure p1 to the central region 21. The first pressure p1 is less than the ambient pressure above the substrate W, so that the substrate W is clamped onto the support table WT.

In an embodiment, the support table WT comprises a second channel 27. The second channel is for applying a second pressure p2 to a peripheral region 22 of the support table WT under a peripheral portion WP of the substrate W. The second channel 27 is radially outwards of the first channel 26. In an embodiment, the second channel 27 is provided through the main body 20 of the support table WT. In an alternative embodiment, the second channel 27 is provided as a gap between the main body 20 and an extraction body that radially surrounds that main body 20. In an embodiment the second channel 27 is connected to a pressure circuit configured to apply the second pressure p2 to the peripheral region 22.

In an embodiment, the support table WT comprises a seal member 24. The seal member 24 is positioned radially between the first channel 26 and the second channel 27. The seal member 24 is positioned at an upper surface of the support table WT. The seal member 24 is annular when viewed in plan view. The seal member 24 protrudes towards the substrate W. However, the seal member 24 does not come into direct contact with the substrate W when the substrate W is clamped onto the support table WT. There is a small gap between the top of the seal member 24 and the back side of the substrate W.

In an embodiment, the support table WT comprises an outer seal 25. The outer seal 25 is positioned radially outward of the second channel 27. The outer seal 25 is positioned at an upper surface of the support table WT. The outer seal 25 is annular when viewed in plan view. The outer seal 25 protrudes towards the substrate W. However, the outer seal 25 does not come into direct contact with the substrate W when the substrate W is clamped onto the support table WT. There is a small gap between the top of the outer seal 25 and the back side of the substrate W.

During an exposure process, fluid is extracted away from the peripheral region 22 through the second channel 27. The second pressure p2 applied by the second channel 27 additionally helps to clamp the substrate W onto the support table WT. The flow of fluid through the second channel 27 helps to reduce the amount of immersion liquid that reaches that back side of the substrate W.

During an exposure process, a seal is formed between the seal member 24 and the substrate W. In particular, a liquid meniscus 23 is stabilised on the seal member 24, between the top of the seal member 24 and the bottom of the substrate W. The liquid meniscus 23 is stabilised based on capillary pressure. The first pressure p1 and the second pressure p2 are controlled so that the difference between them is smaller than the capillary pressure on top of the seal member 24 (i.e. smaller than the force that would be required to remove the liquid meniscus 23 from the seal member 24).

As mentioned above, the first channel 26 and the second channel 27 are connected to one or more pressure circuits, which form part of a vacuum system 40, explained in further detail below. In an embodiment, the vacuum system 40 (i.e. vacuum supply) is configured such that the pressure difference between the first pressure p1 and the second pressure p2 is maintained even when the supply pressure varies.

Figure 5:
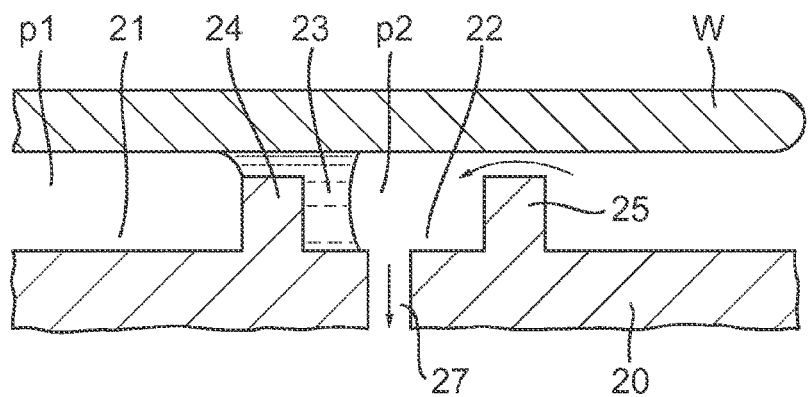
FIG. 5 schematically depicts a close-up of the liquid meniscus stabilised between the substrate and the support table shown in FIG. 4.

The pressure difference between the first pressure p1 and the second pressure p2 is controlled so as to be greater than the capillary pressure in the gap between the substrate W and the support table WT (i.e. in regions apart from the seal member 24). The liquid meniscus 23 thus stabilises at the seal, as depicted in FIG. 5. FIG. 5 is a close-up of the liquid meniscus 23 stabilised at the seal member 24 of the support table WT.

During an exposure process, the seal member 24 is wet because of the presence of the liquid meniscus 23. When the substrate W is unloaded (i.e. removed) from the support table WT, part of the liquid from the liquid meniscus 23 can remain on the substrate W and part of the liquid of the liquid meniscus 23 can remain in contact with the seal member 24. It is desirable to reduce the amount of liquid from the liquid meniscus 23 that remains in contact with the substrate W and on the seal member 24.

As depicted in FIG. 1, in an embodiment the lithographic apparatus comprises a controller 500. The controller 500 is configured to control the vacuum supply connected to the first channel 26 and the second channel 27. The controller 500 is configured to control the first pressure p1 and the second pressure p2 applied to the central region 21 and the peripheral region 22, respectively.

Figure 6:
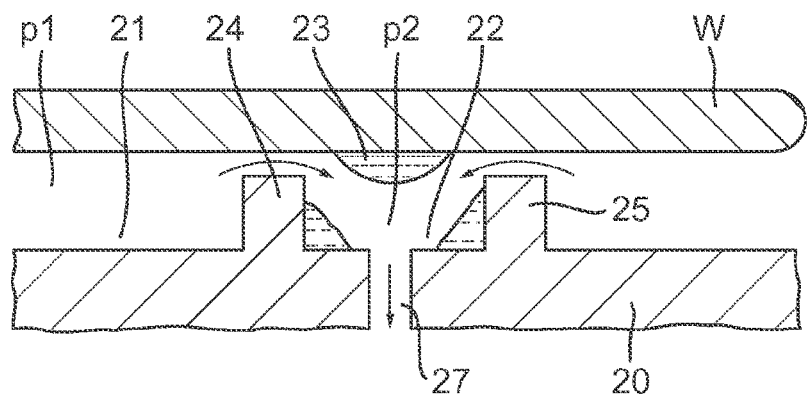
FIG. 6 schematically depicts a close-up of what can happen to the liquid meniscus when the substrate is removed from the support table.

FIG. 6 shows liquid from the liquid meniscus 23 that remains on the substrate W and in contact with the seal member 24 after the substrate W has been unloaded from the support table WT. This remaining liquid is undesirable.

In an embodiment, just before unloading the substrate W, a large pressure difference over the seal member 24 is created by increasing the vacuum level at the peripheral region 22. This is described in more detail below.

In an embodiment, the controller 500 is adapted to control application of the first pressure p1 and the second pressure p2 during an exposure process such that liquid is retained between the substrate W and the seal member 24 during the exposure process. This is the situation depicted in FIG. 5. The function of the controller 500 just prior to and during an unloading process is described below.

Figure 7:
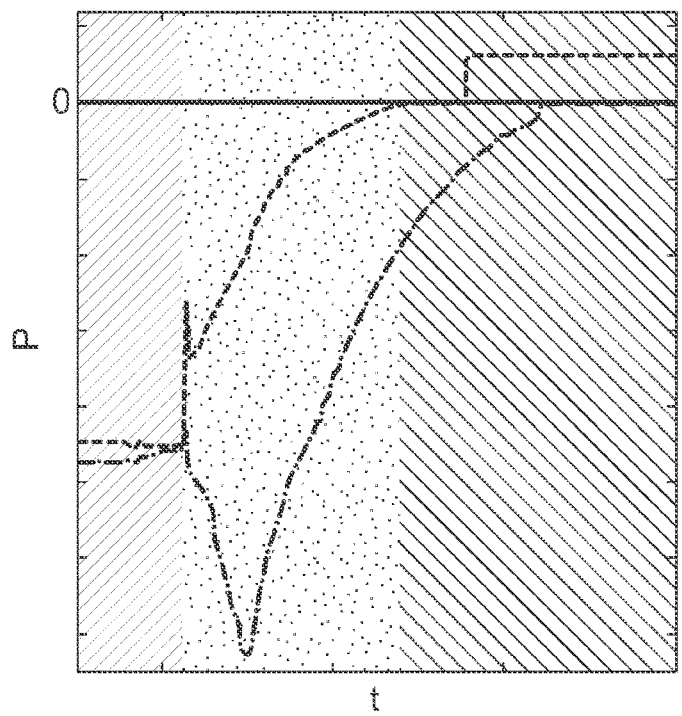
FIG. 7 is a graph showing the relationship between time and pressure in different regions during an unloading process according to an embodiment of the invention.

FIG. 7 is a graph showing the relationship between time and pressure in different regions prior to and during an unloading process. The lower line formed of dots and long dashes shows the second pressure p2 at the peripheral region 22 during the unloading process. The upper line formed of short dashes represents the first pressure p1 at the central region 21 during the unloading process.

The pressure variations shown in FIG. 7 represent merely one example of how the first pressure p1 and the second pressure p2 vary prior to and during the unloading process. However, the present invention is not limited to the specific form of the lines as shown in FIG. 7.

As shown in FIG. 7, in an embodiment the controller 500 is adapted to increase the first pressure p1 towards ambient pressure. This is shown in the central time period (of the three time periods) shown in FIG. 7.

In an embodiment, the controller 500 is adapted to decrease the second pressure p2 such that at least some of the liquid retained between the substrate W and the seal member 24 is removed. This is shown in FIG. 7 at the start of the central time period, where the second pressure p2 decreases.

This occurs before the substrate W is removed from the support table WT. Hence, the second pressure p2 is reduced (and the first pressure p1 is increased) while the substrate W remains supported on the burls of the support table WT. At this time (i.e. before the substrate W is unloaded), at least some of the liquid from the liquid meniscus 23 is removed. The liquid may be removed through the second channel 27.

In an embodiment, the controller 500 is adapted to increase the second pressure p2 towards the ambient pressure during the unloading process. This is shown in the later part of the central time period and in the right-hand time period shown in FIG. 7. In particular, after the second pressure p2 reaches its minimum, the second pressure p2 is increased towards the ambient pressure. By increasing the second pressure p2 towards the ambient pressure, the clamping pressure is reduced such that the substrate W can be removed from the support table WT.

By removing at least some of the liquid before the unloading process, the amount of liquid that remains on the back side of the substrate W after the unloading process is reduced. This reduces any undesirable issues that can occur when the unloaded substrate W is subsequently processed. For example, it is possible for liquid residue at the back side of the unloaded substrate W to cause capillary forces that result in scratches being made on the substrate W. This reduces the quality of the substrate W. In particular, some substrates W can be re-used, meaning that after the substrate W has been unloaded from the support table WT, the unloaded substrate W is later required to be clamped again onto the (or a different) support table WT. A closing substrate is an example of such a substrate W. It is undesirable for such a re-usable substrate W to have liquid residue that could cause it to be scratched, for example.

By removing at least some of the liquid prior to the unloading process, the amount of liquid that remains in contact with the seal member 24 and/or the outer seal 25 is reduced. This reduces the possibility of a subsequent substrate W undesirably adhering in any particular position on the support table WT. This also reduces the risk of having some liquid being accidentally transferred to the grids used for measurements. This also reduces the amount of liquid that can evaporate when loading the next substrate W, which would create a cold spot and therefore undesirably deform that support table WT. This also reduces the amount of contamination that is transported on the support table WT.

As explained above, just before unloading the substrate W, a large pressure difference over the seal member 24 is created by increasing the vacuum level in the peripheral region 22 and reducing the vacuum level in the central region 21.

As a comparative example, an alternative way to reduce the amount of liquid is to flush the liquid meniscus 23 during the sequence of unloading the substrate W. First, a puff of gas can be applied to the central region 21 while the vacuum is maintained in the peripheral region 22. As a result, the pressure difference between the first pressure p1 and the second pressure p2 increases to be greater than the capillary pressure on the seal member 24. This results in the seal member 24 being cleared of the liquid meniscus 23. Afterwards, the vacuum for the second pressure p2 can be switched off so that the second pressure p2 increases and the substrate W can be released.

An embodiment of the invention is expected to achieve an improvement over this comparative example. In particular, an embodiment of the invention is expected to reduce wearing out of the burls at the edge of the support table WT. This is because if an overpressure is applied below the central portion WC of the substrate W while still maintaining the second pressure p2 under the peripheral portion WP of the substrate W, the substrate W bends in the shape of an umbrella. The edge of the substrate W slips over the burls at the edge of the substrate W. This wears out the burls.

An embodiment of the invention is expected to achieve a reduction in bending of the substrate W. In an embodiment of the invention, no overpressure (i.e. increasing the first pressure p1 to be greater than ambient pressure) is applied under the central portion WP of the substrate W. Accordingly, wear of the burls due to bending of the substrate W is reduced.

Figure 8:
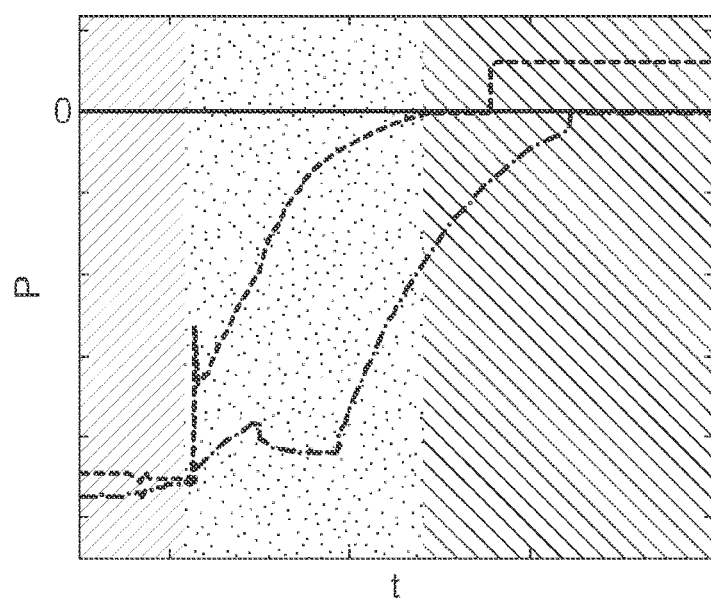
FIG. 8 is a graph showing the relationship between time and pressure in different regions according to a comparative example.

As a further comparative example, it is possible to unload a substrate W by gradually increasing both the first pressure p1 and the second p2 towards the ambient pressure. FIG. 8 is a graph showing the relationship between time and pressure in the different regions when unloading a substrate W according to such a comparative example. In FIG. 8, the lower line represents the second pressure p2 and the upper line represents the first pressure p1.

The sequences illustrated in FIGS. 7 and 8 do not involve an overpressure being applied under the central portion WC of the substrate W until after the vacuum applied under the peripheral portion WP of the substrate W has been significantly weakened. FIGS. 7 and 8 show that the first pressure p1 may be increased to above ambient pressure in the final phase of unloading. The overpressure causes the substrate W to deform into an umbrella shape. This can cause the substrate W to slip over the outer burls. However, this slip occurs with minimal normal force on the burl because the second pressure p2 is so close to ambient pressure when the first pressure p1 is greater than ambient pressure. As a result, wearing out of the burls at the edge of the support table WT is reduced. However, the sequence shown in FIG. 8 results in an undesirable amount of liquid from the liquid meniscus 23 remaining on the substrate W and/or on the support table WT.

An embodiment of the invention is expected to achieve an improvement over the above-described comparative example. In particular, an embodiment of the invention is expected to reduce the amount of liquid that creeps back onto the seal member 24, while avoiding the bending of the substrate W at its edge during an unloading process.

In particular, the sequence shown in FIG. 8 results in liquid creeping back onto the seal member 24 as soon as the second pressure p2 is increased. As a result, the seal member 24 remains wet, which undesirably causes the next substrate W to adhere onto the support table WT.

As shown in FIG. 7, in an embodiment the controller 500 is adapted to increase the first pressure p1 while decreasing the second pressure p2 so as to remove at least some of the liquid retained between the substrate W and the seal member 24. This is shown at the start of the central time period shown in FIG. 7. The first pressure p1 is increased at the same time that the second pressure p2 is decreased. As a result, the pressure difference between the first pressure p1 and the second pressure p2 increases more quickly, thereby removing the liquid meniscus 23 more quickly. This means that the substrate W can be unloaded from the support table WT more quickly, thereby increasing throughput.

As depicted in FIG. 7, in an embodiment the second pressure p2 reaches a level of the ambient pressure (the zero line on the Y axis) at a time later than the first pressure p1. The second pressure p2 remains lower than the first pressure p1 throughout the process of unloading the substrate W from the support table WT. As depicted in FIG. 7, in an embodiment the second pressure p2 is applied at a level lower than that of the first pressure p1 with respect to the ambient pressure during the unloading process. Hence, throughout the unloading process the liquid is urged away from the central region 21 towards the second channel 27. As a result, any liquid close to the seal member 24 is urged away from the central region 21. For example, the liquid can be removed through the second channel 27, thereby reducing the amount of liquid that remains on the support table WT after the unloading process has finished.

FIGS. 9 to 12 each schematically depict a vacuum system 40 according to an embodiment of the present invention. The vacuum system 40 depicted in FIGS. 9 to 12 can be used to implement the pressure sequence described above (e.g. the pressure sequence shown in FIG. 7).

Figure 15:
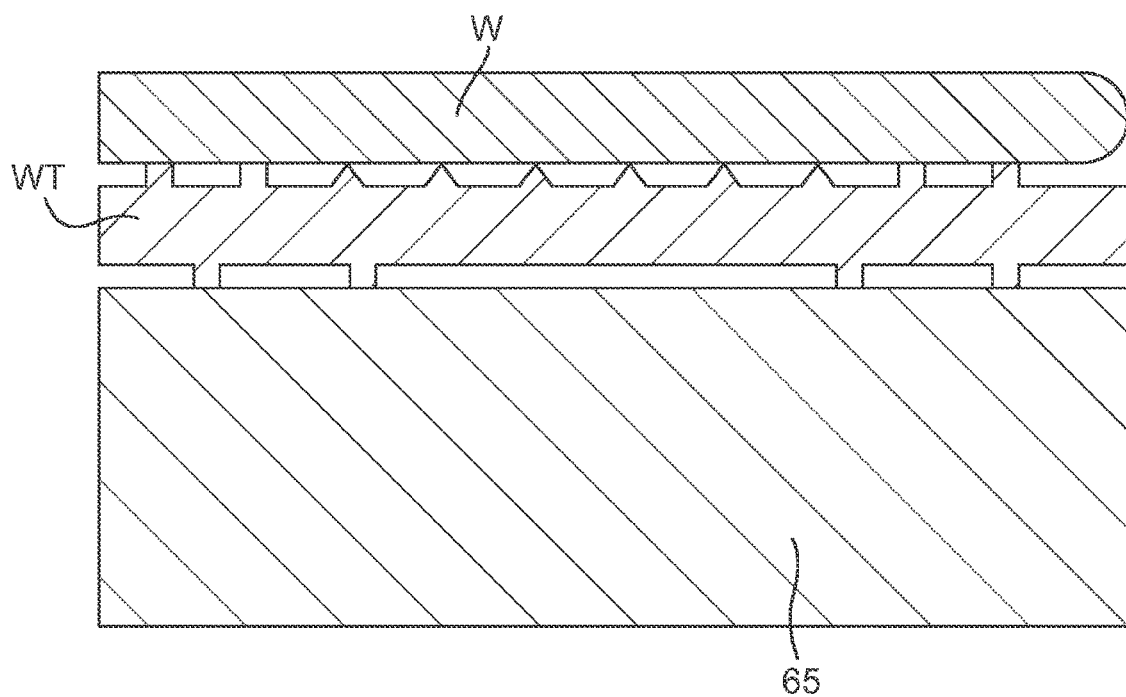
FIG. 15 schematically depicts a side cross sectional view of a substrate supported on a support table according to an embodiment of the invention.

The vacuum system 40 is for the support table WT, which is for holding the substrate W. The vacuum system 40 comprises a flow circuit that comprises a first pressure circuit 43. The first pressure circuit 43 comprises a first vacuum pressure line 49. The first vacuum pressure line 49 is for clamping the support table WT onto a substrate table 65 (e.g. as depicted in FIG. 15). In an embodiment the flow circuit of the vacuum system 40 comprises a second pressure circuit 42. The second pressure circuit 42 comprises a second vacuum pressure line 41 and a third vacuum pressure line 54. The third vacuum pressure line 54 is configured to apply the first pressure p1 to the central region 21 of the support table WT under the central portion WP of the substrate W so as to clamp the substrate W to the support table WT. For example, in an embodiment the third vacuum pressure line 54 is connected to the first channel 26.

As depicted in FIG. 15, in an embodiment the support table WT is supported by the substrate table 65. The support table WT is clamped onto the substrate table 65 by applying a pressure less than ambient pressure between the support table WT and the substrate table 65. In an embodiment, the second positioner PW (shown in FIG. 1) comprises the substrate table 65. In general, movement of the support table WT may be realized using a long-stroke module and a short-stroke module, which form part of the second positioner PW. In an embodiment the short-stroke module comprises the substrate table 65. The first pressure circuit 43 is configured to apply a pressure for clamping the support table WT to second positioner PW.

In an embodiment the flow circuit of the vacuum system 40 comprises the second pressure circuit 42. The second pressure circuit 42 is configured to apply the second pressure p2 to the peripheral region 22 of the support table WT under the peripheral portion WP of the substrate W. In an embodiment the second pressure circuit 42 comprises a vacuum device. The vacuum device is configured to provide a pressure to the second pressure circuit 42.

As depicted in each of FIGS. 9 to 12, in an embodiment the second pressure circuit 42 comprises the second vacuum pressure line 41. For example, in an embodiment the second vacuum pressure line 41 is connected to the second channel 27 so as to apply the second pressure p2 to the peripheral region 22. In an embodiment the second pressure circuit 42 comprises a third vacuum pressure line 50 branching off the second pressure circuit 42.

A depicted in each of FIGS. 9 to 12, the flow circuit of the vacuum system 40 comprises a first flow controller 44. The first flow controller 44 is configured to control a pressure in the second vacuum pressure line 41. For example, in an embodiment, the first flow controller 44 is a valve that can be opened and closed. When the first flow controller 44 is opened, the second vacuum pressure line 41 is connected to a vacuum supply of the second pressure circuit 42.

As depicted in each of FIGS. 9 to 12, in an embodiment the flow circuit of the vacuum system 40 comprises a second flow controller 45. The second flow controller 45 is configured to control a pressure in the fourth vacuum pressure line 50. For example, in an embodiment the second flow controller 45 is a valve that can be opened and closed.

Figure 9:
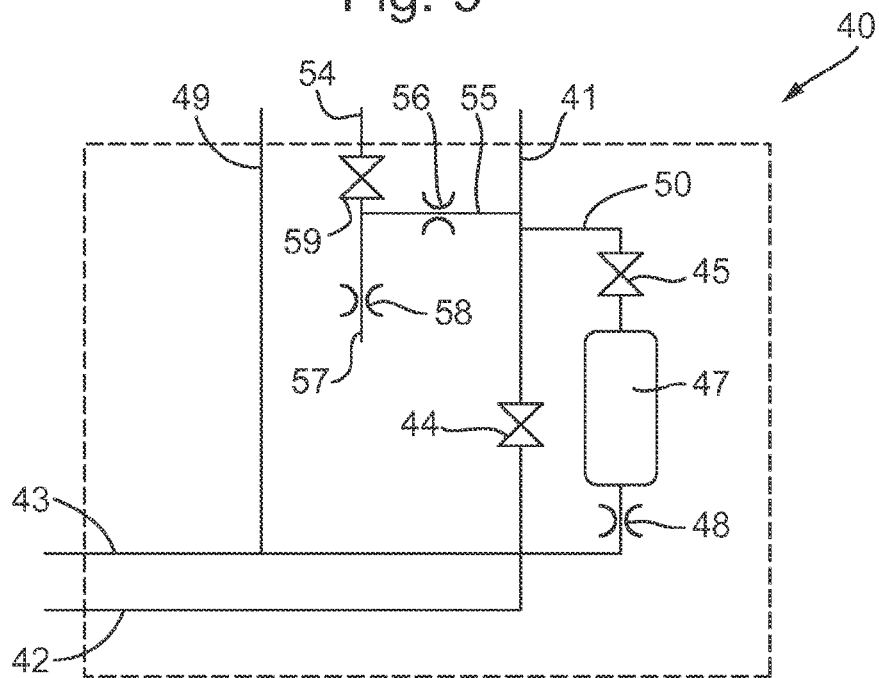
FIGS. 9 to 14 each schematically depicts a diagram of a vacuum system according to embodiments of the invention.
Figure 10:
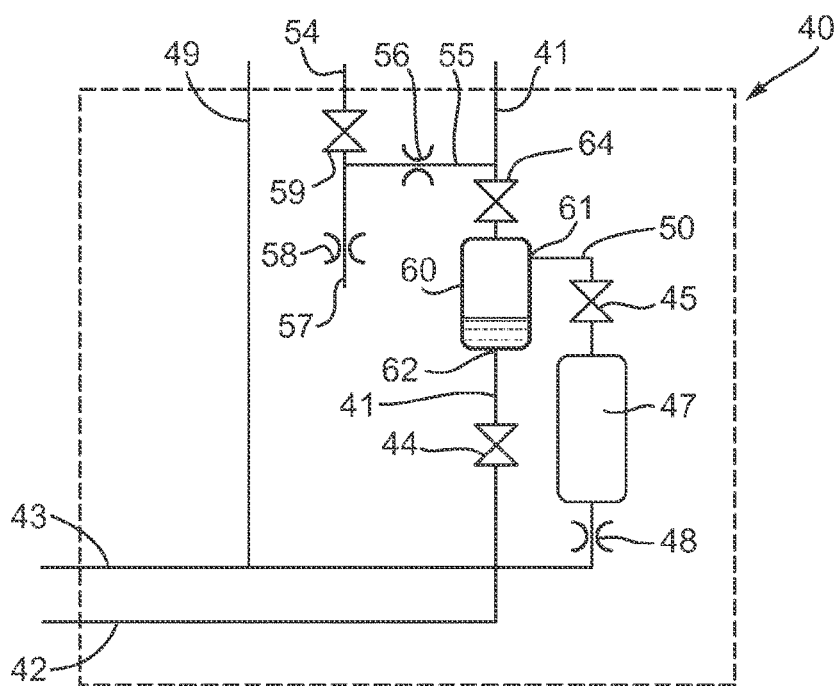
Figure 11:
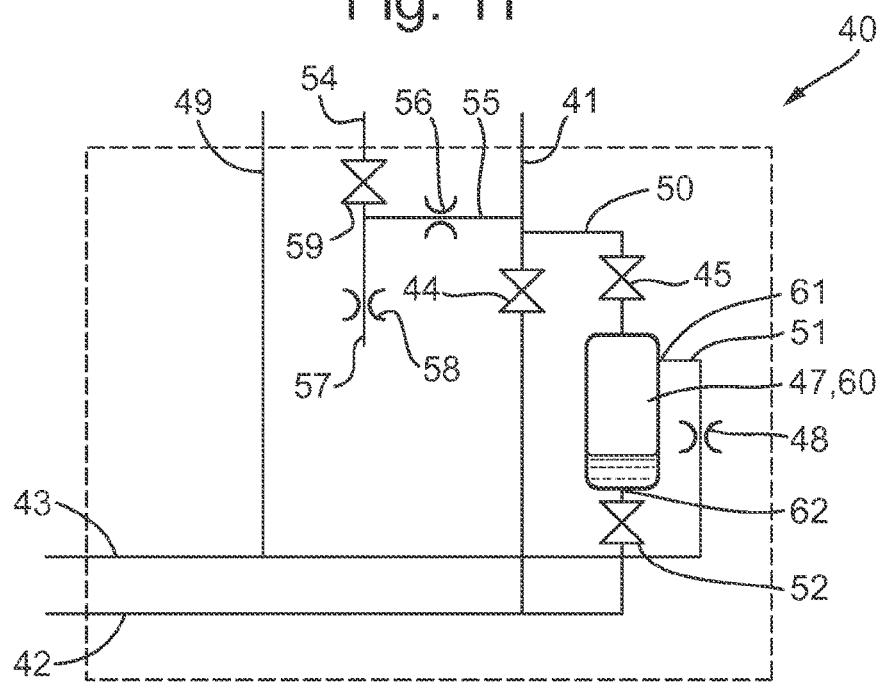

In the embodiments shown in FIGS. 9 to 11, when the second flow controller 45 is opened, the fourth vacuum pressure line 50 is in fluid communication with the first pressure circuit 43. Hence, by switching the first flow controller 44 and the second flow controller 45, the pressure in the second vacuum pressure line 41 can be switched from being supplied by a vacuum supply in the second pressure circuit 42 to being supplied by a vacuum supply in the first pressure circuit 43. As a result, the second pressure p2 can be controlled by switching the first flow controller 44 and the second flow controller For example, in an embodiment the vacuum supply of the first pressure circuit 43 provides a lower pressure (i.e. stronger vacuum) compared to the vacuum supply of the second pressure circuit 42. Hence, during an exposure process, the first flow controller 44 is opened and the second flow controller 45 is closed so that the second pressure p2 is controlled by the vacuum supply of the second pressure circuit 42. Just before an unloading process begins, the first flow controller 44 can be closed and the second flow controller 45 can be opened so that the second pressure p2 is reduced to the pressure supplied by the vacuum supply of the pressure circuit 43.

The support table WT is clamped onto the substrate table 65 by vacuum pressure. The substrate W is clamped onto the support table WT by vacuum pressure. In an embodiment, the pressure applied to the region between the support table WT and the substrate table 65 is lower than the pressure applied to the region between the substrate W and the support table WT.

In the embodiments depicted in FIGS. 9 to 12, during an exposure process the first vacuum pressure line 49 is configured to provide a lower pressure compared to the second vacuum pressure line 41 or the third vacuum pressure line 54. The first pressure circuit 43 is capable of supplying a lower pressure (i.e. a deeper vacuum) than the second pressure circuit 42.

As depicted in each of FIGS. 9 to 12, in an embodiment the second vacuum pressure line 41 is connected to the third vacuum pressure line 54. A connecting line 55 is provided for connecting the second vacuum pressure line 41 to the third vacuum pressure line 54. The same vacuum pressure source supplies an underpressure to both the second vacuum pressure line 41 and the third vacuum pressure line 54. For example, during an exposure process, the second pressure circuit 42 supplies an underpressure to both the second pressure line 41 and third vacuum pressure line 54. When it is necessary to remove the liquid meniscus 23 (e.g. for an unloading process), the source of the underpressure for the second pressure line 41 and third vacuum pressure line 54 is switched. In the embodiments depicted in FIGS. 9 to 11, the source of the underpressure is switched from the second pressure circuit 42 to the first pressure circuit 43. In the embodiment depicted in FIG. 12, the source of the underpressure is switched from the second pressure circuit 42 to the third pressure circuit 63.

As depicted in FIGS. 9 to 12, in an embodiment the vacuum system 40 comprises a fourth flow controller 58. The fourth flow controller 58 is for controlling flow from ambient pressure to the third vacuum pressure line 54. For example, in an embodiment the fourth flow controller 58 is a restriction. The flow from ambient pressure to the third vacuum pressure line 54 increases the pressure provided by the third vacuum pressure line 54 to the central region 21. As a result, the first pressure p1 supplied to the central region 21 is greater than the second pressure p2 applied to the peripheral region 22. The fourth flow controller 58 is configured such that during an exposure operation the difference between the first pressure p1 and the second pressure p2 is within a predetermined range.

As depicted in FIGS. 9 to 12, in an embodiment the vacuum system 40 comprises a first ambient pressure line 57. The first ambient pressure line 57 is in fluid communication with the third vacuum pressure line 54. The fourth flow controller 58 is provided in the first ambient pressure line 57. The first ambient pressure line 57 connects ambient pressure to the third vacuum pressure line 54 via the fourth flow controller 58.

As depicted in FIGS. 9 to 11 in an embodiment the vacuum system 40 comprises a sixth flow controller 56. The sixth flow controller 56 is provided in the connecting line 55 that connects the second vacuum pressure line 41 to the third vacuum pressure line 54. The sixth flow controller 56 is configured to control flow between the second vacuum pressure line 41 and the third vacuum pressure line 54. For example, in an embodiment the sixth flow controller 56 is a restriction configured to restrict flow. In an embodiment, the sixth flow controller 56 restricts flow from the third vacuum pressure line 54 to the second vacuum pressure line 41. This helps to retain the difference in pressure between the second vacuum pressure line 41 and the third vacuum pressure line 54. As explained above, there is also a flow from ambient pressure to the third vacuum pressure line 54. The sixth flow controller 56 is configured to restrict flow from ambient pressure to the second vacuum pressure line 41.

As depicted in FIGS. 9 to 12, in an embodiment the vacuum system 40 comprises a seventh flow controller 59. The seventh flow controller 59 is provided in the third vacuum pressure line 54. The seventh flow controller 59 is configured to control pressure in the third vacuum pressure line 54. In an embodiment, the seventh flow controller 59 is a valve that can be opened and closed. During an exposure process, the seventh flow controller 59 is opened and the first flow controller 44 is also opened. The first pressure p1 can be increased by closing the seventh flow controller 59.

As depicted in each of FIGS. 9 to 11, in an embodiment the vacuum device comprises a vacuum chamber 47. The vacuum chamber 47 is upstream of a third flow controller 48. The third flow controller 48 is configured to control flow from the vacuum chamber 47 to the first pressure circuit 43. As depicted in FIGS. 9 and 10, in an embodiment the third flow controller 48 is in the fourth vacuum pressure line 50. Alternatively, as depicted in FIG. 11, in an embodiment the third flow controller 48 is in the fifth vacuum pressure line 51 (which will be described in more detail later). In an embodiment, the third flow controller 48 comprises a restriction configured to limit the continuous flow from the vacuum chamber 47 to the vacuum supply of the first pressure circuit 43.

When the first flow controller 44 is closed and the second flow controller 45 is opened, the second vacuum pressure line 41 is brought into fluid communication with the vacuum chamber 47. As a result, the second pressure p2 reduces towards the pressure in the vacuum chamber 47.

This reduction in the second pressure p2 may be applied for less than one second, optionally less than 0.5 seconds, optionally less than 0.2 seconds and optionally less than 0.1 seconds. The second pressure p2 is reduced so as to remove the liquid meniscus 23 from between the seal member 24 and the substrate W.

After the second pressure p2 has been reduced, the second pressure is then increased back towards ambient pressure as shown in FIG. 7. At this time, the second flow controller 45 can be closed and the pressure in the vacuum chamber 47 can be reduced back down towards the pressure supplied by the vacuum supply of the first pressure circuit 43.

Whenever the second flow controller 45 is opened, the underpressure provided by the second vacuum pressure line 41 is boosted. This means that the second pressure p2 is temporarily reduced. When this happens, the vacuum pressure in the first pressure circuit 43 quickly increases. This is because the first pressure circuit 43 is exposed to the higher vacuum pressure in the second vacuum pressure line 41. After the temporary reduction of the underpressure provided by the second vacuum pressure line 41, the original vacuum level supplied by the first pressure circuit 43 is recovered. The vacuum chamber 47 is for storing vacuum pressure and releasing it when boosting the underpressure provided by the second vacuum pressure line 41. By providing that the vacuum device comprises the vacuum chamber 47, the original vacuum level can be recovered more quickly. This is useful for increasing the throughput of substrates W. In particular, this reduces any waiting time required for the vacuum level supplied by the first pressure circuit 43 to be recovered in between uses. The vacuum level in the vacuum chamber 47 can be recovered during measuring and exposure processes (i.e. between substrate exchange sequences) at a low flow rate, so as not to disturb other vacuum levels.

Figure 12:
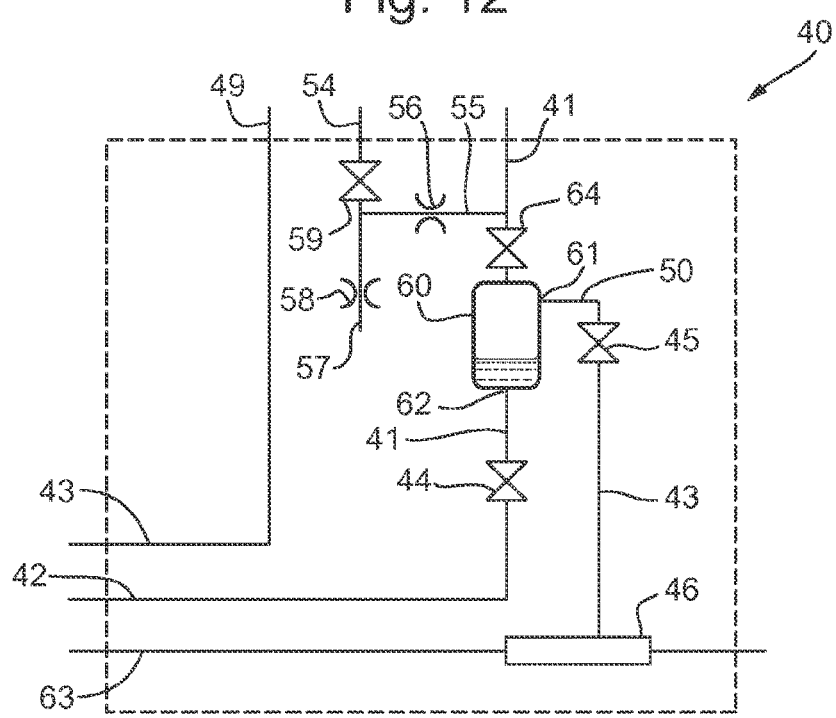

As depicted in each of FIGS. 10 to 12, in an embodiment the vacuum system 40 comprises a separation chamber 60. The separation chamber 60 is for separation of a two-phase flow. A two-phase flow is a flow that comprises both liquid and gas. The separation chamber 60 is provided in the second pressure circuit 42. The two-phase flow enters into the separation chamber 60 from the second vacuum pressure line 41 (e.g. from the second channel 27).

Liquid is output from the separation chamber 60 via the liquid outlet 62. Gas is output from the separation chamber 60 through the gas outlet 61. The liquid outlet 62 is positioned at the bottom of the separation chamber 60. Liquid from the two-phase flow collects at the bottom of the separation chamber 60 due to gravity. As depicted in FIGS. 10 and 12, in an embodiment the liquid can then be extracted from the separation chamber 60 when the first flow controller 44 is opened. Alternatively, as depicted in FIG. 11, in an embodiment a fifth flow controller 52 is provided in the fourth vacuum pressure line 50. The liquid can be extracted from the separation chamber 60 when the fifth flow controller 52 is opened. However, when the first flow controller 44 (referring to FIG. 10 or 12) or the fifth flow controller 52 (referring to FIG. 11) is closed, the liquid remains in the separation chamber 60. In an embodiment, liquid extraction is blocked when the second pressure p2 is being reduced (e.g. when the second flow controller 45 is opened). The liquid extraction is then restored when the second flow controller 45 is closed and the first flow controller 44 is opened. This occurs after the substrate W has been unloaded.

By providing the separation chamber 60, the amount of liquid that is output to the first pressure circuit 43 is reduced or eliminated. This protects elements of the first pressure circuit 43 from liquid. A second advantage is that by having single phase flow through the first pressure circuit 43, the pressure in the first vacuum pressure line 49 is more stable. This is because a two-phase flow typically creates undesirable pressure variation.

The separation chamber 60 does not require a deeper vacuum level for extracting liquid compared to the vacuum level used for the gas extraction. Accordingly, it is possible for the gas outlet 61 to be connected to the first pressure circuit 43, which has the lowest pressure (referring to FIGS. 10 and 11).

In an embodiment, the vacuum chamber 60 has a volume of at least one millilitre, optionally at least 2 millilitres, optionally at least 5 millilitres. In an embodiment, the separation chamber 60 has a volume of at most 10 millilitres, optionally at most 5 millilitres, and optionally at most 2 millilitres.

As depicted in FIGS. 10 and 12, the separation chamber 60 is upstream of the first flow controller 44 and the second flow controller 45. As depicted in FIGS. 10 and 12 in an embodiment, the separation chamber 60 is in fluid communication with the second vacuum pressure line 41 and the fourth vacuum pressure line 50.

The fourth vacuum pressure line 50 is connected to the gas outlet 61 of the separation chamber 60. The first flow controller 44 is configured to control liquid extraction from the separation chamber 60. The second flow controller 45 is configured to control whether or not the second vacuum pressure line 41 is connected to the lower pressure used just before the unloading process.

In an embodiment, the second vacuum pressure line 41 is configured for a flow of liquid and the fourth vacuum pressure line 50 is configured for a flow of gas (referring to FIGS. 10 and 12). Hence, when the first flow controller 44 is opened, liquid flows from the separation chamber 60 into the second vacuum pressure line 41 and through the first flow controller 44. Meanwhile substantially no liquid passes through the fourth vacuum pressure line 50 because the liquid is separated from the two-phase flow by the separation chamber 60. As a result, the first pressure circuit 43 that provides the lowest pressure can be kept dry.

As depicted in each of FIGS. 9 to 12, in an embodiment the vacuum device 46, 47 is downstream of the second flow controller 45 and configured to provide the pressure to the fourth vacuum pressure line 50. When the second flow controller 45 is closed, the lower pressure is not applied to the peripheral region 22. When the second flow controller 45 is opened (and the first flow controller 44 is closed), the lower pressure is applied to the peripheral region 22.

As depicted in each of FIGS. 9 to 11, in an embodiment the fourth vacuum pressure line 50 is in fluid communication with the first pressure circuit 43. This means that the first pressure circuit 43 can be used not only for clamping the support table WT to the substrate table 65, but also for applying the lower pressure to the peripheral region 22 just prior to an unloading process and to the vacuum chamber 47 during an exposure process.

In an embodiment, the third flow controller 48 is configured to control the amount of flow from the second pressure circuit 42 into the first pressure circuit 43 (referring to FIGS. 9 to 11). In the embodiments shown in FIGS. 9 to 11, the third flow controller 48 is a restriction that allows the pressure in the vacuum chamber 47 to be slowly decreased, for example during exposure and measurement operations.

As depicted in FIG. 12, in an embodiment the vacuum device comprises a venturi pump 46. The venturi pump 46 produces vacuum by means of the venturi effect. In an embodiment, the venturi pump 46 is an aspirator, which is a type of ejector-jet pump.

As depicted in FIG. 12, in an embodiment the fourth vacuum pressure line 50 is in fluid communication with a third pressure circuit 63. The third pressure circuit 63 has a vacuum produced by the venturi pump 46. The venturi pump 46 is an alternative way to create the deep vacuum for reducing the second pressure p2 prior to an unloading process. A venturi pump 46 can be quite small for small vacuum flows. In an embodiment, the third pressure circuit 63 comprises a supply of compressed dry air. The supply of compressed dry air is provided to the venturi pump 46 so as to produce the venturi effect that in turn produces the vacuum.

By providing that the vacuum device comprises a venturi pump 46, the vacuum supply of the first pressure circuit 43 is not affected by reducing the second pressure p2.

In an embodiment, the supply of compressed dry air in the third pressure circuit 63 may further be used for blowing air towards the substrate W during unloading of the substrate W. In an embodiment, the compressed dry air is further used to activate the flow controllers.

Differences between the embodiment of FIG. 11 compared to the embodiments of FIGS. 9 and 10 are highlighted below. As depicted in FIG. 11, in an embodiment the vacuum chamber 47 and the separation chamber 60 can be combined. In an embodiment the vacuum system 40 comprises a fifth vacuum pressure line 51. The fifth vacuum pressure line 51 branches off the fourth vacuum pressure line 50. The fifth vacuum pressure line 51 is for connecting the combined vacuum chamber 47 and separation chamber 60 to the first pressure circuit 43.

As depicted in FIG. 11, in an embodiment the separation chamber 60 is downstream of the second flow controller 45 and upstream of a fifth flow controller 52 in the fourth vacuum line 50 and in fluid communication with the fourth vacuum pressure line 50 and the fifth vacuum pressure line 51.

As depicted in FIG. 11, in an embodiment the fourth vacuum pressure line 50 is in fluid communication with the second pressure circuit 42 and the fifth vacuum pressure line 51 is in fluid communication with the first pressure circuit 43.

In an embodiment, the fourth vacuum pressure line 50 is configured for a flow of liquid and gas and the fifth vacuum pressure line 51 is configured for a flow of gas. Hence, the fourth vacuum pressure line 50 is connected to the separation chamber 60 for inputting the two-phase flow. A downstream section of the fourth vacuum pressure line 50 is connected to the liquid outlet 62 of the separation chamber 60. The fifth vacuum pressure line 51 is connected to the gas outlet 61 of the separation chamber 60.

Hence, as depicted in FIG. 11, in an embodiment the vacuum chamber 47 comprises the separation chamber 60. The vacuum system 40 comprises the third flow controller 48 for controlling a pressure in the fifth vacuum pressure line 51. The third flow controller 48 in this embodiment works in the same way as the third flow controller 48 does in the embodiments of FIGS. 9 and 10. That is to say, the third flow controller 48 comprises a restriction configured to limit the continuous flow from the vacuum chamber 47 to the vacuum supply of the first pressure circuit 43.

In an embodiment, the second pressure p2 is configured at a lower pressure than the first pressure p1 with respect to ambient pressure at a point in time during unloading of the substrate W. This is also shown in FIG. 7. Additionally, the second pressure p2 is configured to be reduced at a point in time during unloading of the substrate W.

In each of the embodiments shown in FIGS. 9 to 12, the second pressure p2 supplied by the second vacuum pressure line 41 can be temporarily decreased by switching which vacuum source is connected to the second vacuum pressure line 41. Two alternative embodiments that do not have this function will be descripted with reference to FIGS. 13 and 14.

Figure 13:
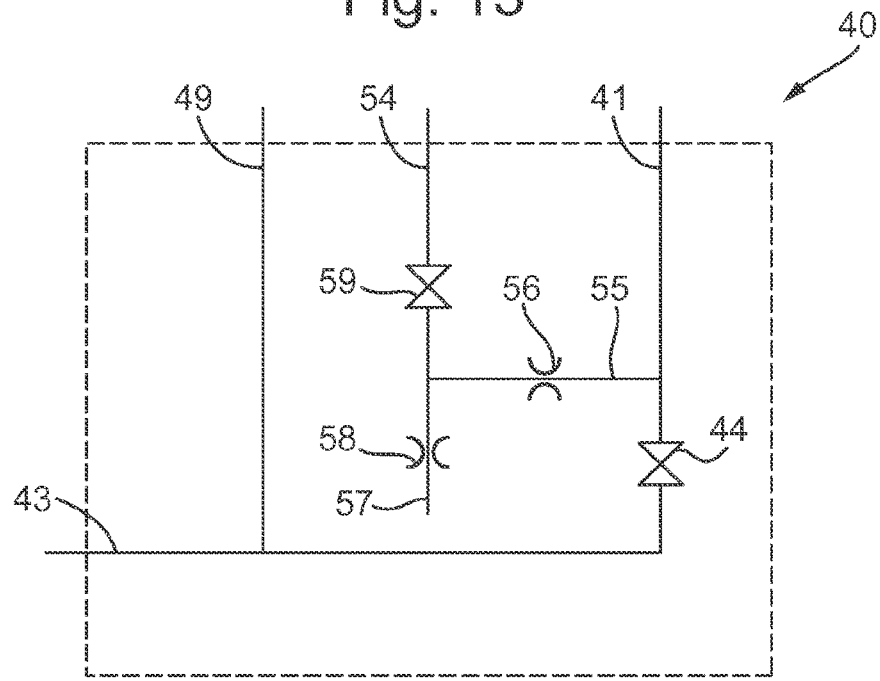
Figure 14:
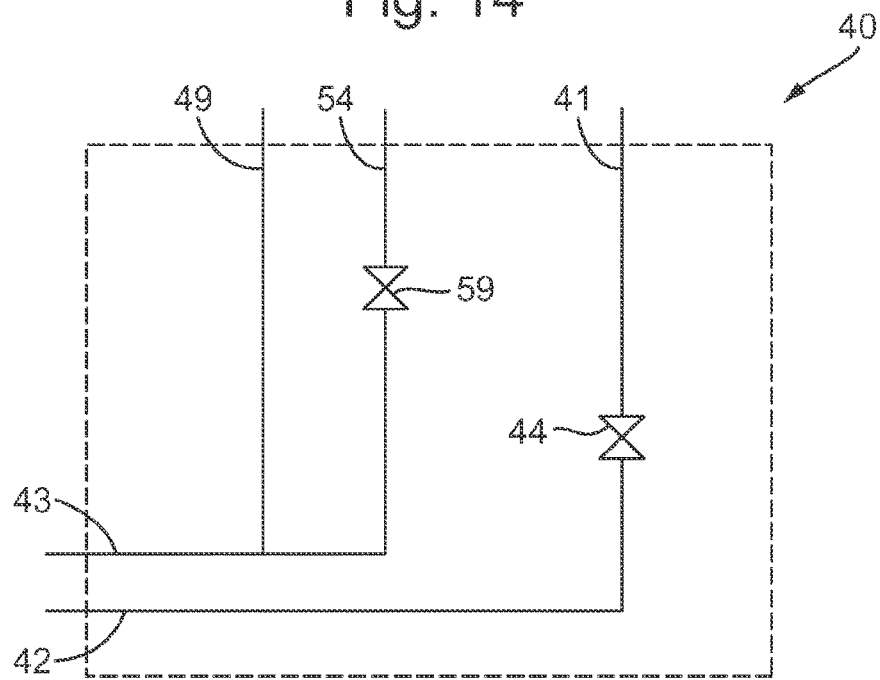

Some of the components in the embodiments of FIGS. 13 and 14 are the same as the components in the embodiments of FIGS. 9 to 12. Where this is the case, the same reference numerals have been used in the Figures and detailed description is omitted.

In the embodiment shown in FIG. 13, each of the first vacuum pressure line 49, the second vacuum pressure line 41 and the third vacuum pressure line 54 is comprised in the first pressure circuit 43. The second pressure circuit 42 is not required. The first pressure circuit 43 is configured to provide a deep vacuum for clamping the support table WT to the substrate table 65. Hence, in the embodiment of FIG. 13, the pressure applied between the substrate W and the support table WT may be more similar to the pressure applied to the region between the support table WT and the substrate table 65. This is different from the embodiments shown in FIGS. 9 to 12 in which the pressure for clamping the support table WT to the substrate table 65 is much lower than the pressure for clamping the substrate W to the support table WT.

During an unloading process, the seventh flow controller 59 is closed. This causes the first pressure p1 applied to the central region 21 to rise towards ambient pressure. This increases the difference between the first pressure p1 and the second pressure p2. When the difference is great enough, at least part of the liquid of the meniscus 23 is removed. Subsequently, the first flow controller 44 is closed. This causes the second pressure p2 to rise towards ambient pressure. The substrate W can then be lifted away from the support table WT.

Hence, the unloading process using the embodiment of FIG. 13 may follow a pattern similar to that indicated in FIG. 8. However, the second vacuum pressure line 41 and the third vacuum pressure line 54 are connected to the deeper vacuum source of the first presser circuit 43. As a result, when the seventh flow controller 59 is closed, there can be a greater increase in pressure difference between the first pressure p1 and the second pressure p2. The greater pressure difference helps to remove the meniscus 23 in such a way that less liquid remains on the back surface of the substrate W and on the seal member 24.

As depicted FIG. 14, in an embodiment the third vacuum pressure line 54 is comprised in the first pressure circuit 43. Accordingly, during an exposure process, a deep vacuum is provided in the central region 21 as the first pressure p1. As depicted in FIG. 14, in an embodiment the second pressure circuit 42 is provided. The second pressure 42 comprises the second vacuum pressure line 41. In the embodiments depicted in FIGS. 9 to 12 the first pressure circuit 43 is configured to provide a deeper vacuum compared to the second pressure circuit 42. However, in the embodiment of FIG. 14 the second pressure circuit 42 is configured to provide a similarly deep vacuum as the first pressure circuit 43. This makes it possible for the pressure difference between the first pressure p1 (provided by the third vacuum pressure line 54) and the second pressure p2 (provided by the second vacuum pressure line 41) to be small during an exposure process. It is desirable for the pressure difference to be small during an exposure process so that the seal is formed on the seal member 24. If the pressure difference is too great during an exposure process, then the liquid that forms the seal would be removed, such that there would be no seal.

During an unloading process, the seventh flow controller 59 is closed so that the first pressure p1 increases. This increases the pressure difference between the first pressure p1 and the second pressure p2, so as to remove the meniscus 23. Subsequently, the first flow controller 44 is closed so that the second pressure p2 increases towards ambient pressure. The substrate W can then be removed from the support table WT.

In the embodiment of FIG. 14, during an exposure process both the first pressure p1 and the second pressure p2 correspond to a deep vacuum. As a result, when a seventh flow controller 59 is closed, there is a large pressure difference between the first pressure p1 and the second pressure p2. This pressure difference can be large enough so that the meniscus 23 is removed and so as to reduce the amount of liquid that remains on the substrate W and/or on the support table WT after the unloading process.

Figure 16:
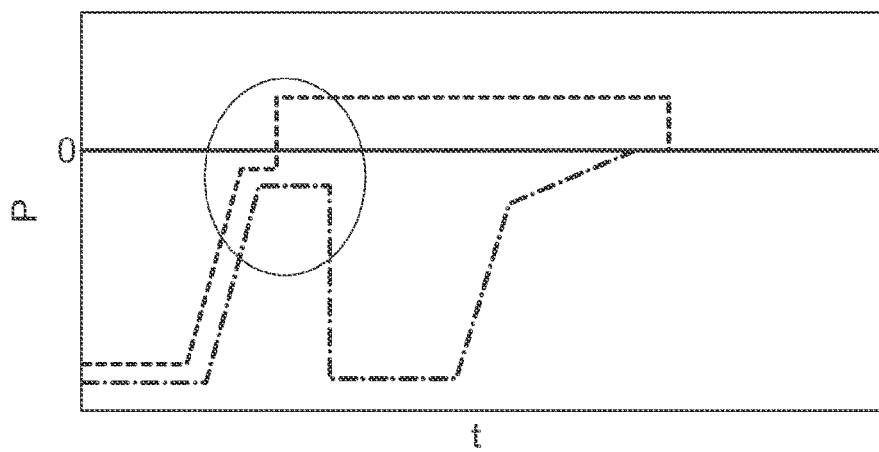
FIG. 16 is a graph showing the relationship between time and pressure in different regions during an unloading process according to an embodiment of the invention.

FIG. 16 is a graph showing the relationship between time and pressure in different regions prior to and during an unloading process. The lower line formed of dots and long dashes shows the second pressure p2 at the peripheral region 22 during the unloading process. The upper line formed of short dashes represents the first pressure p1 at the central region 21 during the unloading process.

The pressure variations shown in FIG. 16 are merely schematic and represent one example of how the first pressure p1 and the second pressure p2 vary prior to and during the unloading process. However, the present invention is not limited to the specific form of the lines as shown in FIG. 16.

As shown in FIG. 16, in an embodiment the controller 500 is adapted to increase the first pressure p1 towards ambient pressure. As shown in FIG. 16, the controller 500 is further adapted to increase the second pressure p2 towards ambient pressure at the same time as increasing the first pressure p1 towards ambient pressure. In an embodiment, a pressure difference between the first pressure p1 and the second pressure p2 remains substantially constant while the first pressure p1 and the second pressure p2 are increased towards ambient pressure.

After the first pressure p1 and the second pressure p2 have been increased towards ambient pressure, the first pressure p1 and the second pressure p2 reach substantially constant levels. This may be called the steady state. In the steady state, the pressure difference between the first pressure p1 and the second pressure p2 is substantially equal to the pressure difference during the exposure process.

In an embodiment, the controller 500 is adapted to decrease the second pressure p2 such that at least some of the liquid retained between the substrate W and the seal member 24 is removed. This is shown in FIG. 16 where the second pressure p2 is decreased at the end of its steady state value.

This occurs before the substrate W is removed from the support table WT. Hence, the second pressure p2 is reduced while the substrate W remains supported on the burls of the support table WT. At this time, i.e. before the substrate W is unloaded, at least some of the liquid from the liquid meniscus 23 is removed. The liquid may be removed through the second channel 27.

In an embodiment, an overpressure is applied to the central region 21 so as to cause the substrate W to bulge. When the substrate W bulges, the shape of the substrate W deforms to have an upside-down bowl shape. When the substrate W bulges, the substrate W loses contact with the burls in the central region 21. However, the substrate W remains in contact with the support table WT at the periphery. The bulging of the substrate W helps to open up a gap between the seal member 24 and the substrate W. The increased gap between the seal member 24 and the substrate W helps in the removal of liquid retained between the substrate W and the seal member 24. An embodiment of the invention is expected to achieve an increase in the amount of liquid drained away from between the substrate W and the seal member 24.

In an embodiment, the overpressure is applied to the central region 21 so as to cause the substrate W to bulge before decreasing the second pressure p2. The second pressure p2 is decreased after the gap between the seal member 24 and the substrate W has been increased. When the second pressure p2 is decreased, a greater amount of liquid can be removed from between the seal member 24 and the substrate W.

FIG. 16 shows the overpressure being applied to the central region 21. This is shown in the section of FIG. 16 that is highlighted by the oval border. As shown in the highlighted oval section of FIG. 16, the first pressure p1 is increased to above ambient pressure. The substrate W bulges at some time shortly after the overpressure is applied.

As depicted in FIG. 16, in an embodiment the overpressure is applied at a time after the step of increasing the first pressure p1 towards ambient pressure when the first pressure p1 is substantially constant and a pressure difference between the first pressure p1 and the second pressure p2 is substantially equal to that during the exposure pressure. The overpressure is applied when the first pressure p1 and the second pressure p2 are in the steady state. In the steady state, the first pressure p1 and the second pressure p2 have predetermined known values. These values can be controlled, as will be described in more detail later. Hence, the overpressure is applied to the central region 21 so as to cause the substrate W to bulge at a time when the first pressure p1 and the second pressure p2 (and their difference) have known values. The known values are closer to ambient pressure compared to the first pressure p1 and the second pressure p2 during an exposure process. In other words, the clamping pressure is greatly reduced in the steady state. The overpressure is applied when there is a greatly reduced clamping pressure.

When the overpressure is applied, the substrate W bulges. When the substrate W bulges, the edge of the substrate W slips over the outermost burl on the support table WT. The slipping can cause wear of the burls. However, this slipping occurs when the clamping pressure is greatly reduced. As a result, the frictional energy that can wear out the outer burls is greatly reduced. The frictional force that can wear out the burls is directly proportional to the clamping force when the slipping occurs.

According to an embodiment of the present invention, it is possible to control when the bulging of the substrate W occurs. The bulging is considered to occur when the deformation of the substrate W is complete so that the shape of the substrate W no longer changes but has the upside-down bowl shape. An embodiment of the invention is expected to achieve a reduction in wearing of the outer burls of the support table WT.

Figure 17:
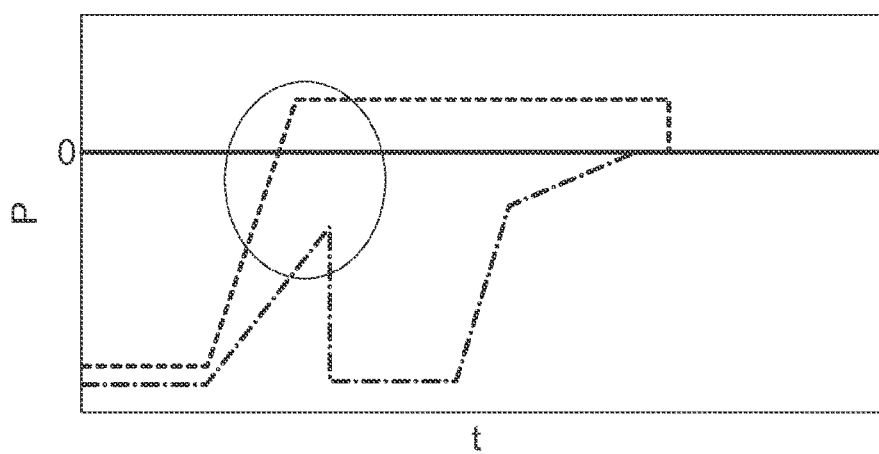
FIG. 17 is a graph showing the relationship between time and pressure in different regions according to a comparative example.

FIG. 17 is a graph showing the relationship between time and pressure in different regions during an unloading process according to a comparative example. In the comparative example, the overpressure is applied to the central region 21 at a time when there is a greater pressure difference between the first pressure p1 and the second pressure p2. The overpressure is applied to the central region 21 at a time when the second pressure p2 clamping the peripheral part of the substrate W is lower compared to in the embodiment shown in FIG. 16. As a result, the substrate W bulges at a time when there is a greater clamping pressure compared to in an embodiment of the present invention. This means that when the edge of the substrate W slips over the outer burls on the support table WT, there is a greater force that can wear out the outer burls. This is because of the greater clamping pressure at the time when the overpressure is applied to the central region 21.

As depicted in FIG. 16, the controller 500 is adapted to increase the second pressure p2 towards the ambient pressure during the unloading process. In particular, after the second pressure p2 has been reduced so as to remove some of the liquid, the second pressure p2 is increased towards the ambient pressure. By increasing the second pressure p2 towards the ambient pressure, the clamping pressure is reduced such that the substrate W can be removed from the support table WT.

Figure 18:
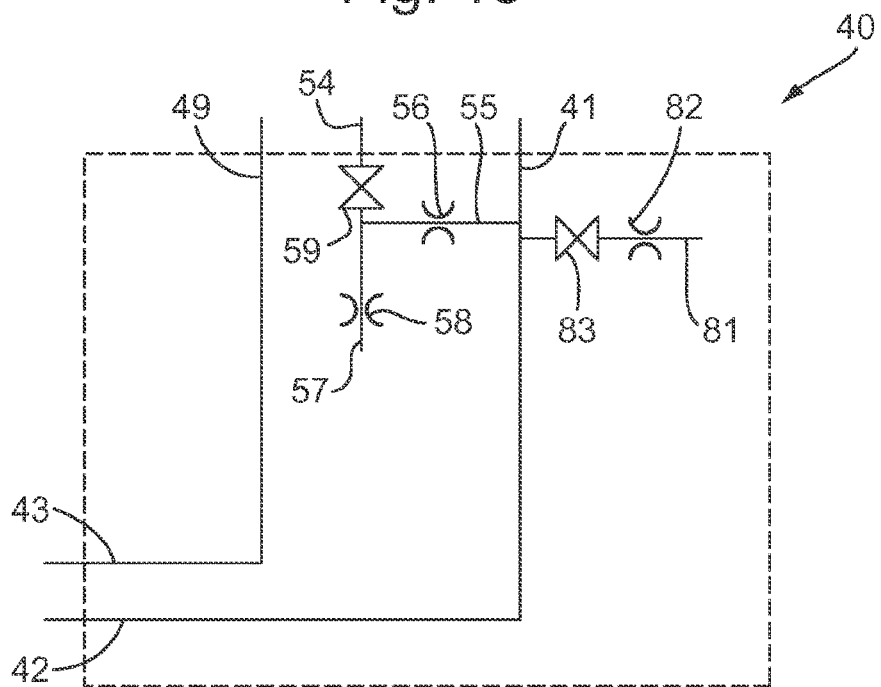
FIGS. 18 to 22 schematically depict diagrams of vacuum systems according to embodiments of the invention.

FIG. 18 schematically depicts a vacuum system 40 according to an embodiment of the present invention. The vacuum system 40 depicted in FIG. 18 can be used to implement the pressure sequence described above (e.g. the pressure sequence shown in FIG. 16).

The vacuum system 40 is for the support table WT, which is for holding the substrate W. The vacuum system 40 comprises a flow circuit that comprises a first pressure circuit 43. The first pressure circuit 43 comprises a first vacuum pressure line 49. The first vacuum pressure line 49 is for clamping the support table WT onto the substrate table 65.

In an embodiment, the flow circuit of the vacuum system 40 comprises a second pressure circuit 42. The second pressure circuit 42 comprises a second vacuum pressure line 41 and a third vacuum pressure line 54. The third vacuum pressure line 54 is configured to apply the first pressure p1 to the central region 21 so as to clamp the substrate W to the support table WT. The second vacuum pressure line 41 is connected to the second channel 27 so as to apply the second pressure p2 to the peripheral region 22.

Some of the components in the embodiments of FIGS. 18 to 22 are the same as the components in the embodiments of FIGS. 9 to 14. Where this is the case, the same reference numerals have been used in the figures and detailed description is omitted.

As depicted in FIG. 18, in an embodiment the vacuum system 40 comprises the sixth flow controller 56. The second vacuum pressure line 41 is connected to the third vacuum pressure line 54 via the sixth flow controller 56. The sixth flow controller 56 is configured to control flow between the second vacuum pressure line 41 and the third vacuum pressure line 54.

The first ambient pressure line 57 provides a flow from ambient pressure to the third vacuum pressure line 54. The sixth flow controller 56 is configured to restrict flow from the ambient pressure to the second vacuum pressure line 41. This helps to retain the difference in pressure between the second vacuum pressure line 41 and the third vacuum pressure line 54. By retaining the difference in pressure (i.e. the small difference in pressure) between the second vacuum pressure line 41 and the third vacuum pressure line 54, the liquid can be retained between the seal member 24 and the substrate W. Otherwise, if a small pressure difference could not be maintained between the second vacuum pressure line 41 and the third vacuum pressure line 54, then there would be increased risk that the liquid could be undesirably removed thereby breaking the seal during an exposure process, for example.

As depicted in FIG. 18, in an embodiment the vacuum system 40 comprises a second ambient pressure line 81. The second ambient pressure line 81 fluidly connects the second vacuum pressure line 41 to ambient pressure. An eighth flow controller 82 is configured to control flow from ambient pressure to the second vacuum pressure line 41. For example, in an embodiment the eighth flow controller 82 is a restriction configured to restrict flow.

In an embodiment, the vacuum system 40 comprises a ninth flow controller 83. The ninth flow controller 83 is a valve that can be opened and closed. During an exposure process, the ninth flow controller 83 is closed. However, the ninth flow controller 83 is opened for an unloading process.

As described above and shown in FIG. 16, prior to unloading a substrate W, the first pressure p1 and the second pressure p2 are increased towards ambient pressure together (i.e. maintaining a small difference in pressure between the first pressure p1 and the second pressure p2). The first pressure p1 and the second pressure p2 are increased to their steady state values. This is achieved by opening the ninth flow controller 83. When the ninth flow controller 83 is opened, the second vacuum pressure line 41 is connected to ambient pressure along the second ambient pressure line 81 via the eighth flow controller 82. This allows flow from ambient pressure to the second vacuum pressure line 41. This increases the second pressure p2. At the same time, the increase in pressure in the second vacuum pressure line 41 increases the pressure in the third vacuum pressure line 54 such that the first pressure p1 increases at the same rate.

With the ninth flow controller 83 open, the first pressure p1 and the second pressure p2 continue to increase towards ambient pressure until the steady state values are reached. The steady state values depend on the configuration of the eighth flow controller 82. If the eighth flow controller 82 allows a greater flow from ambient pressure to the second vacuum pressure line 41, then the steady state values are closer to ambient pressure. Hence, by selecting the size of the orifice in the restriction of the eighth flow controller 82, the steady state values for the first pressure p1 and the second pressure p2 can be controlled. In an embodiment, the steady state value for the first pressure p1 is in the range of from about 1 kPa to about 20 kPa below ambient pressure. Optionally, the steady state value for the first pressure p1 is in the range of from about 5 kPa to about 10 kPa below ambient pressure.

As depicted in FIG. 18, the vacuum system 40 is provided with a bleed (i.e. the second ambient pressure line 81 with the eighth flow controller 82) with a valve (i.e. the ninth flow controller 83). In normal clamping operation, the bleed is closed (by ensuring that the ninth flow controller 83 is closed) for full clamping of the substrate W. During unloading of the substrate W, the bleed is opened (by opening the ninth flow controller 83) to reduce the clamping pressure for the substrate W. Once the reduced clamping pressure is reached at the steady state, an overpressure is supplied to the central region 21 so that the substrate W bulges. The edge of the substrate W slips over the outer burls while the clamping at the edge of the substrate W is at its steady state reduced level. This reduces the frictional energy for the outer burls.

As will be appreciated, the above-described features can be used with other embodiments. For example, FIG. 16 shows that the second pressure p2 is reduced to about the same level as during an exposure operation (i.e. at the extreme left side of the graph in FIG. 16). However, the second pressure p2 could be reduced to a level that is lower than that during an exposure process. This would help remove liquid from between the seal member 24 and the substrate W. This could be achieved using a vacuum system 40 as depicted in any of FIGS. 19 to 22, for example.

Figure 19:
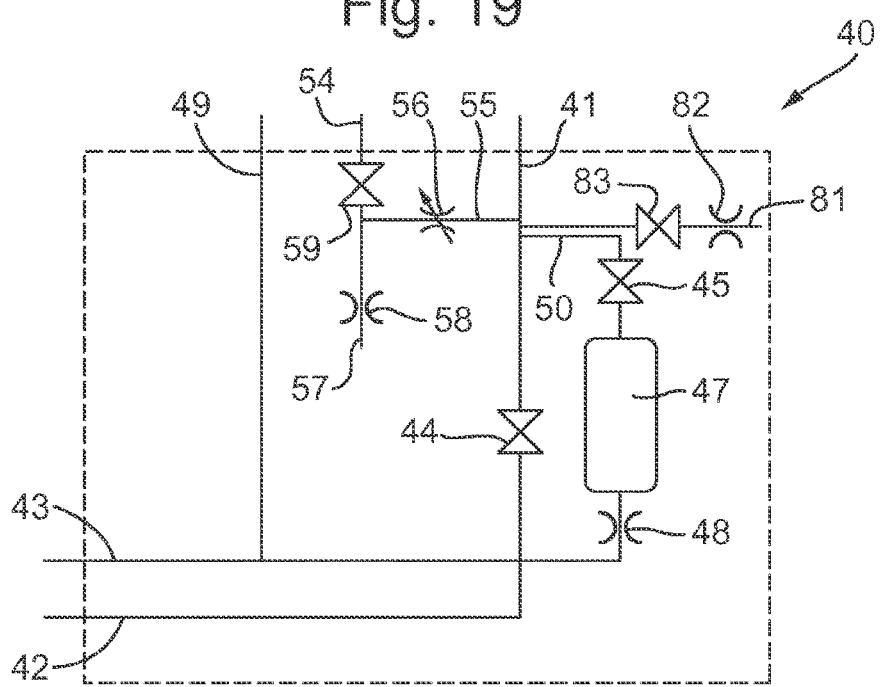

FIG. 19 schematically depicts a vacuum system 40 in which the second ambient pressure line 81, the eighth flow controller 82 and the ninth flow controller 83 are applied to the vacuum system 40 depicted in FIG. 9. The ninth flow controller 83 is opened so as to increase the first pressure p1 and the second pressure p2 to their steady state values (i.e. reduced clamping pressure). An overpressure is then applied to the central region 21 so as to deform the substrate W to form a bulged shape. Once bulged, the second flow controller 45 is opened so that the second pressure p2 is reduced to a level below that during an exposure process. The third vacuum pressure line 54 is disconnected from the second vacuum pressure line 41 when the bulge is implemented. For example, the sixth flow controller 56 may be closed. The sixth flow controller 56 may be a variable restriction.

Figure 20:
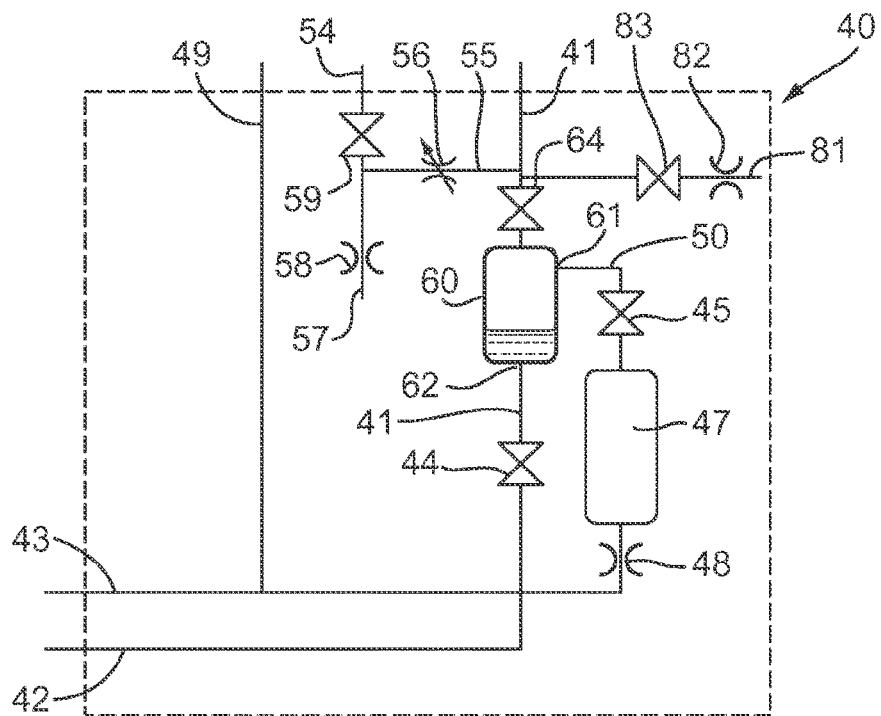

FIG. 20 schematically depicts a vacuum system 40 in which the second ambient pressure line 81, the eighth flow controller 82 and the ninth flow controller 83 are applied to the vacuum system 40 depicted in FIG. 10. The ninth flow controller 83 is opened so as to increase the first pressure p1 and the second pressure p2 to their steady state values (i.e. reduced clamping pressure). An overpressure is then applied to the central region 21 so as to deform the substrate W to form a bulged shape. Once bulged, the second flow controller 45 is opened so that the second pressure p2 is reduced to a level below that during an exposure process.

Figure 21:
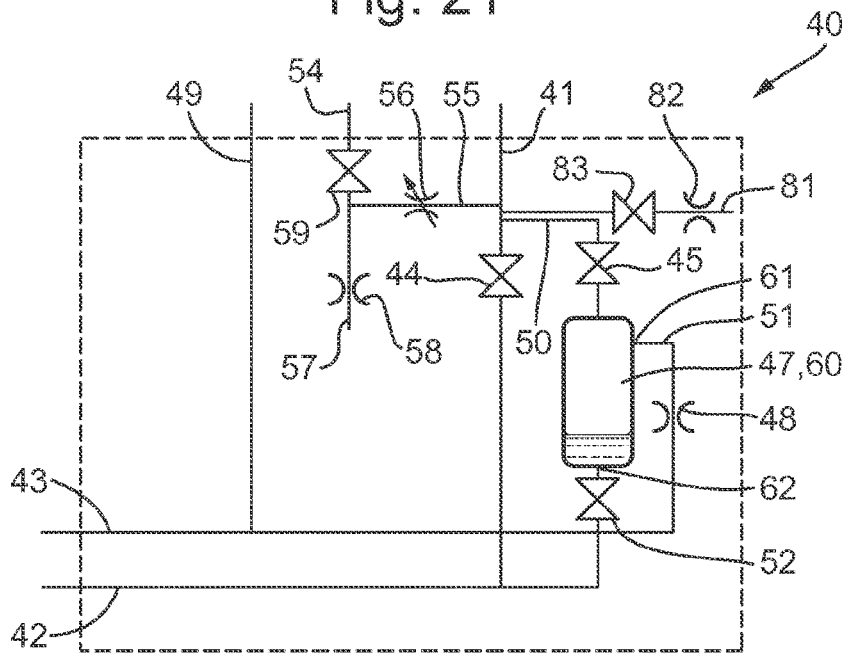

FIG. 21 schematically depicts a vacuum system 40 in which the second ambient pressure line 81, the eighth flow controller 82 and the ninth flow controller 83 are applied to the vacuum system 40 depicted in FIG. 11. The ninth flow controller 83 is opened so as to increase the first pressure p1 and the second pressure p2 to their steady state values (i.e. reduced clamping pressure). An overpressure is then applied to the central region 21 so as to deform the substrate W to form a bulged shape. Once bulged, the second flow controller 45 is opened so that the second pressure p2 is reduced to a level below that during an exposure process.

Figure 22:
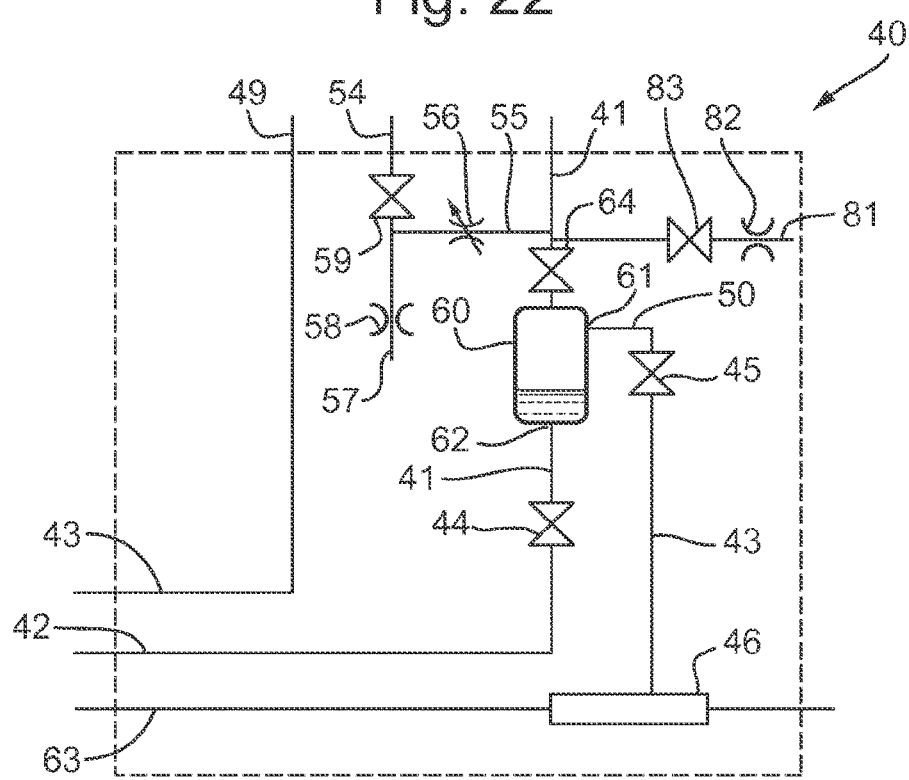

FIG. 22 schematically depicts a vacuum system 40 in which the second ambient pressure line 81, the eighth flow controller 82 and the ninth flow controller 83 are applied to the vacuum system 40 depicted in FIG. 12. The ninth flow controller 83 is opened so as to increase the first pressure p1 and the second pressure p2 to their steady state values (i.e. reduced clamping pressure). An overpressure is then applied to the central region 21 so as to deform the substrate W to form a bulged shape. Once bulged, the second flow controller 45 is opened so that the second pressure p2 is reduced to a level below that during an exposure process.

Embodiments are provided according to the following clauses:

1. A method of unloading an object from a support table during an unloading process, the object clamped to the support table during an exposure process by: applying a first pressure to a central region of the support table under a central portion of the object; and applying a second pressure to a peripheral region of the support table under a peripheral portion of the object, wherein during clamping the first pressure and the second pressure are controlled such that liquid is retained between the object and a seal member that is positioned radially between the central region and the peripheral region at an upper surface of the support table and protrudes towards the object, the method comprising:
   increasing the first pressure towards ambient pressure;
   removing at least some of the liquid retained between the object and the seal member by decreasing the second pressure; and
   increasing the second pressure towards the ambient pressure.
2. The method of clause 1, wherein the step of removing at least some of the liquid comprises decreasing the second pressure relative to that during the exposure process.
3. The method of clause 1 or clause 2, wherein an overpressure is applied to the central region so as to cause the object to bulge before decreasing the second pressure.
4. The method of clause 3, wherein the overpressure is applied at a time after the step of increasing the first pressure towards ambient pressure when the first pressure is substantially constant and a pressure difference between the first pressure and the second pressure is substantially equal to that during the exposure process.
5. A lithographic apparatus comprising:
   a support table for holding an object, the support table comprising:
      a first channel for applying a first pressure to a central region thereof under a central portion of the object;
      a second channel for applying a second pressure to a peripheral region thereof under a peripheral portion of the object; and a seal member positioned radially between the first channel and the second channel at an upper surface of the support table and protruding towards the object; and a controller adapted to:
control application of the first pressure and the second pressure during an exposure process such that liquid is retained between the object and the seal member during the exposure process;
increase the first pressure towards ambient pressure;
decrease the second pressure such that at least some of the liquid retained between the object and the seal member is removed; and
increase the second pressure towards the ambient pressure during an unloading process.

6. A vacuum system for a substrate table and a support table of a lithographic apparatus, the support table being for holding an object, the vacuum system comprising a flow circuit that comprises:
a first pressure circuit comprising a first vacuum pressure line configured to clamp the support table to the substrate table;
a second pressure circuit comprising:
a second vacuum pressure line configured to apply a second pressure to a peripheral region of the support table under a peripheral portion of the object;
a third vacuum pressure line configured to apply a first pressure to a central region of the support table under a central portion of the object so as to clamp the object to the support table;
a vacuum device configured to provide a pressure to the second pressure circuit; and
a fourth vacuum pressure line branching off the second pressure circuit;
a first flow controller for controlling a pressure in the second vacuum pressure line; and
a second flow controller for controlling a pressure in the fourth vacuum pressure line.

7. The vacuum system according to clause 6, further comprising a separation chamber for separation of a two-phase flow in the second pressure circuit.

8. The vacuum system according to clause 6 or clause 7, wherein the vacuum device comprises a vacuum chamber upstream of a third flow controller in the fourth vacuum pressure line.

9. The vacuum system according to clause 8, wherein the fourth vacuum pressure line is in fluid communication with the first pressure circuit.

10. The vacuum system according to clause 6 or clause 7, wherein the vacuum device comprises a venturi pump.

11. A vacuum system for a substrate table and a support table of a lithographic apparatus, the support table being for holding an object, the vacuum system comprising a flow circuit that comprises:
a first pressure circuit comprising:
a first vacuum pressure line configured to clamp the support table to the substrate table;
a second vacuum pressure line configured to apply a second pressure to a peripheral region of the support table under a peripheral portion of the object;
a third vacuum pressure line configured to apply a first pressure to a central region of the support table under a central portion of the object so as to clamp the object to the support table;
a flow controller for controlling a pressure in the second vacuum pressure line; and
a further flow controller for controlling flow from ambient pressure to the third vacuum pressure line.

12. A vacuum system for a substrate table and a support table of a lithographic apparatus, the support table being for holding an object, the vacuum system comprising a flow circuit that comprises:
a first pressure circuit comprising:
a first vacuum pressure line configured to clamp the support table to the substrate table; and
a third vacuum pressure line configured to apply a first pressure to a central region of the support table under a central portion of the object so as to clamp the object to the support table;
a second pressure circuit comprising a second vacuum pressure line configured to apply a second pressure to a peripheral region of the support table under a peripheral portion of the object;
a flow controller for controlling a pressure in the second vacuum pressure line; and
a further flow controller for controlling a pressure in the third vacuum pressure line.

13. A vacuum system for a substrate table and a support table of a lithographic apparatus, the support table being for holding an object, the vacuum system comprising a flow circuit that comprises:
a first pressure circuit comprising:
a first vacuum pressure line configured to clamp the support table to the substrate table; and
a second pressure circuit comprising:
a second vacuum pressure line configured to apply a second pressure to a peripheral region of the support table under a peripheral portion of the object; and
a third vacuum pressure line configured to apply a first pressure to a central region of the support table under a central portion of the object so as to clamp the object to the support table, wherein the third vacuum pressure line is connected to the second vacuum pressure line via a flow controller for retaining a predetermined difference in pressure between the second vacuum pressure line and the third vacuum pressure line; and a further flow controller for controlling flow from ambient pressure to the second vacuum pressure line.

14. A positioner for positioning a support table of a lithographic apparatus, the positioner comprising the vacuum system of any of clauses 6 to 13.

15. A lithographic apparatus comprising the positioner of clause 14.

As will be appreciated, any of the above-described features can be used with any other feature and it is not only those combinations explicitly described which are covered in this application. For example, an embodiment of the invention could be applied to the example of FIG. 3.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A system for a lithographic apparatus, the system comprising:
    a first pressure line configured to provide a first pressure to clamp a support table to a substrate table of the lithographic apparatus, the support table configured to hold an object;
    a second pressure line configured to apply a second pressure to a peripheral region of the support table under a peripheral portion of the object;
    a third pressure line configured to apply a third pressure to a central region of the support table under a central portion of the object so as to provide clamping of the object to the support table;
    a connecting line to connect the second pressure line to the third pressure line; and
    a fourth pressure line configured to provide a flow from ambient pressure to the third pressure line, and the fourth pressure line is in fluid communication with the connecting line.

2. The system according to claim 1, further comprising a first flow controller configured to control a pressure in the second pressure line.

3. The system according to claim 2, wherein the first flow controller is upstream of the connecting line.

4. The system according to claim 1, further comprising a second flow controller configured to control a pressure in the third pressure line.

5. The system according to claim 4, wherein the second flow controller is downstream of the fourth pressure line.

6. The system according to claim 1, further comprising a third flow controller configured to control flow in the connecting line.

7. The system according to claim 6, wherein the third flow controller comprises a restriction configured to restrict flow, and the fourth pressure line is connected to the connecting line downstream of the restriction.

8. The system according to claim 1, wherein the second pressure line is connected to a vacuum supply.

9. The system according to claim 1, configured to supply compressed gas to the second pressure line so as to blow gas towards the object during unloading of the object.

10. A support table configured to support a substrate in a lithographic apparatus, the support table comprising:
    a plurality of projections arranged to support the substrate;
    a first channel configured to apply a first pressure to a central region under a central portion of the substrate;
    a second channel configured to apply a second pressure to a peripheral region under a peripheral portion of the substrate; and
    a seal member positioned between the first and second channels at an upper surface of the support table and protruding towards the substrate,
    wherein the first channel and the second channel are in fluid communication with the system according to claim 1.

11. A system for a lithographic apparatus, the system comprising:
    a first pressure line configured to provide a first pressure to clamp a support table to a substrate table of the lithographic apparatus, the support table configured to hold an object;
    a second pressure line configured to apply a second pressure to a peripheral region of the support table under a peripheral portion of the object;
    a third pressure line configured to apply a third pressure to a central region of the support table under a central portion of the object so as to provide clamping of the object to the support table;
    a fourth pressure line configured to provide a flow from ambient pressure to the third and fourth pressure lines; and
    a flow controller configured to control flow of ambient pressure to the third and fourth pressure lines.

12. The system according to claim 11, further comprising a flow controller configured to control a pressure in the second pressure line and/or a flow controller configured to control a pressure in the third pressure line.

13. The system according to claim 12, wherein the flow controller configured to control the pressure in the third pressure line is downstream of the fourth pressure line.

14. The system according to claim 11, wherein the second pressure line is connected to a vacuum supply.

15. The system according to claim 11, configured to supply compressed gas to the second pressure line so as to blow gas towards the object during unloading of the object.

16. A support table configured to support a substrate in a lithographic apparatus, the support table comprising:
    a plurality of projections arranged to support the substrate;
    a first channel configured to apply a first pressure to a central region under a central portion of the substrate;
    a second channel configured to apply a second pressure to a peripheral region under a peripheral portion of the substrate; and
    a seal member positioned between the first and second channels at an upper surface of the support table and protruding towards the substrate,
    wherein the first channel and the second channel are in fluid communication with the system according to claim 11.

17. A system for a lithographic apparatus, the system comprising:
    a first pressure line configured to provide a first pressure to clamp a support table to a substrate table of the lithographic apparatus, the support table configured to hold an object;

a second pressure line configured to apply a second pressure to a peripheral region of the support table under a peripheral portion of the object;

a third pressure line configured to apply a third pressure to a central region of the support table under a central portion of the object so as to provide clamping of the object to the support table;

one or more flow controllers configured to connect the second pressure line to vacuum and connect the third pressure line to, at a same time, vacuum and ambient pressure.

18. The system of claim 17, further comprising a connecting line to connect the second pressure line to the third pressure line.

19. The system of claim 18, further comprising a fourth pressure line configured to provide the ambient pressure to the third pressure line, and the fourth pressure line is in fluid communication with the connecting line.

20. A support table configured to support a substrate in a lithographic apparatus, the support table comprising:

a plurality of projections arranged to support the substrate;

a first channel configured to apply a first pressure to a central region under a central portion of the substrate;

a second channel configured to apply a second pressure to a peripheral region under a peripheral portion of the substrate; and a seal member positioned between the first and second channels at an upper surface of the support table and protruding towards the substrate, wherein the first channel and the second channel are in fluid communication with the system according to claim 17.

* * * * *

UNITED STATES PATENT AND TRADEMARK OFFICE
CERTIFICATE OF CORRECTION

| | | |
|---|---|---|
| PATENT NO. | : 11,500,296 B2 | Page 1 of 1 |
| APPLICATION NO. | : 17/519713 | |
| DATED | : November 15, 2022 | |
| INVENTOR(S) | : Giovanna De Simone et al. | |

It is certified that error appears in the above-identified patent and that said Letters Patent is hereby corrected as shown below:

On the Title Page

Item (63) Related U.S. Application Data
Please correct "Continuation of application No. 16/617,242, filed as application No. PCT/EP2018/061287 on Jan. 18, 2018, now Pat. No. 11,175,594" to -- Continuation of application No. 16/617,242, filed as application No. PCT/EP2018/061287 on May 3, 2018, now Pat. No. 11,175,594 --

Signed and Sealed this
Twenty-third Day of May, 2023

Katherine Kelly Vidal
*Director of the United States Patent and Trademark Office*